(12) United States Patent
Leinonen et al.

(10) Patent No.: US 8,188,809 B2
(45) Date of Patent: May 29, 2012

(54) OUTPUT SELECTION OF MULTI-OUTPUT FILTER

(75) Inventors: Marko E. Leinonen, Haukipudas (FI); Seppo O. Rousu, Oulu (FI); Juha P. Valtanen, Oulu (FI)

(73) Assignee: Nokia Corporation, Espoo (FI)

( * ) Notice: Subject to any disclaimer, the term of this patent is extended or adjusted under 35 U.S.C. 154(b) by 627 days.

(21) Appl. No.: 12/315,271

(22) Filed: Dec. 2, 2008

(65) Prior Publication Data
US 2010/0134202 A1 Jun. 3, 2010

(51) Int. Cl.
*H01P 5/12* (2006.01)
*H03H 7/46* (2006.01)
(52) U.S. Cl. .................... 333/132; 333/126; 333/129
(58) Field of Classification Search ........... 333/126–135
See application file for complete search history.

(56) References Cited

U.S. PATENT DOCUMENTS

| | | | | |
|---|---|---|---|---|
| 2,085,953 A * | 7/1937 | Cauer et al. | ............... | 333/132 |
| 2,709,206 A * | 5/1955 | Ferguson | ............... | 330/84 |
| 5,184,096 A * | 2/1993 | Wakino et al. | ............... | 333/175 |
| 5,712,603 A | 1/1998 | Kim et al. | ............... | 333/101 |
| 6,724,278 B1 | 4/2004 | Smith | ............... | 333/133 |
| 6,914,497 B2 * | 7/2005 | Sano et al. | ............... | 333/175 |
| 7,831,210 B1 * | 11/2010 | Freeman et al. | ............... | 455/73 |
| 2003/0179052 A1 * | 9/2003 | Sawdey et al. | ............... | 333/135 |
| 2006/0158281 A1 * | 7/2006 | Garris et al. | ............... | 333/133 |

FOREIGN PATENT DOCUMENTS

| | | |
|---|---|---|
| FI | 117684 B | 1/2007 |
| GB | 809928 | 3/1959 |
| WO | WO-98/42040 | 9/1998 |

OTHER PUBLICATIONS

"Multi-Band RF SAW Filter for Mobile Phone using Surface Mount Plastic Package", Susumu Yoshimoto et al., 2002 IEEE Ultrasonics Symposium-113, 6 pgs.
"Terminal Radio-Frequency Design Challenges", Laurent Noel et al., WCDMA for UMTS-HSPA Evolutio and LTE, Fourth Edition, 2007, pp. 507-533.

* cited by examiner

*Primary Examiner* — Robert Pascal
*Assistant Examiner* — Kimberly Glenn
(74) *Attorney, Agent, or Firm* — Harrington & Smith

(57) ABSTRACT

Described is a filtering arrangement in which a first filter is configured to exhibit a first frequency response FR and has a first node and a second node; a second filter is configured to exhibit a second FR and has a first node and a second node; and a third filter is configured to exhibit a third FR and has a first node and a second node. A first common node interfaces the second node of the first filter with the second node of the second filter; and a second common node interfaces the first node of the second filter with the first node of the third filter. The second FR exhibited by the second filter isolates a first signal on a first signal path between the first node of the first filter and the first common node from a second signal on a second signal path between the second common node and the second node of the third filter.

34 Claims, 15 Drawing Sheets

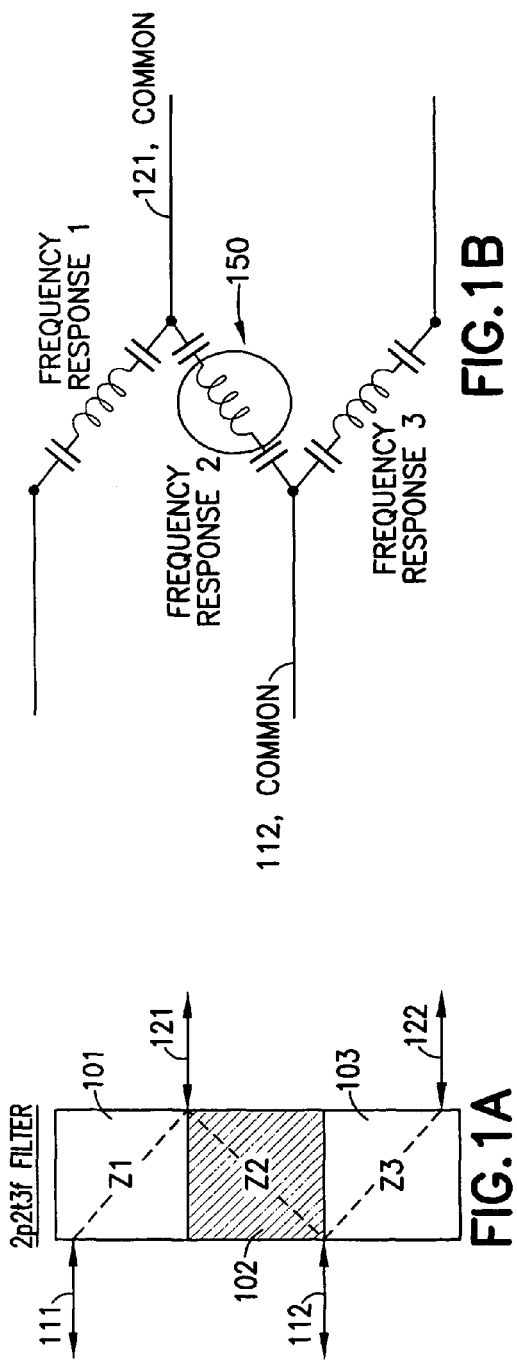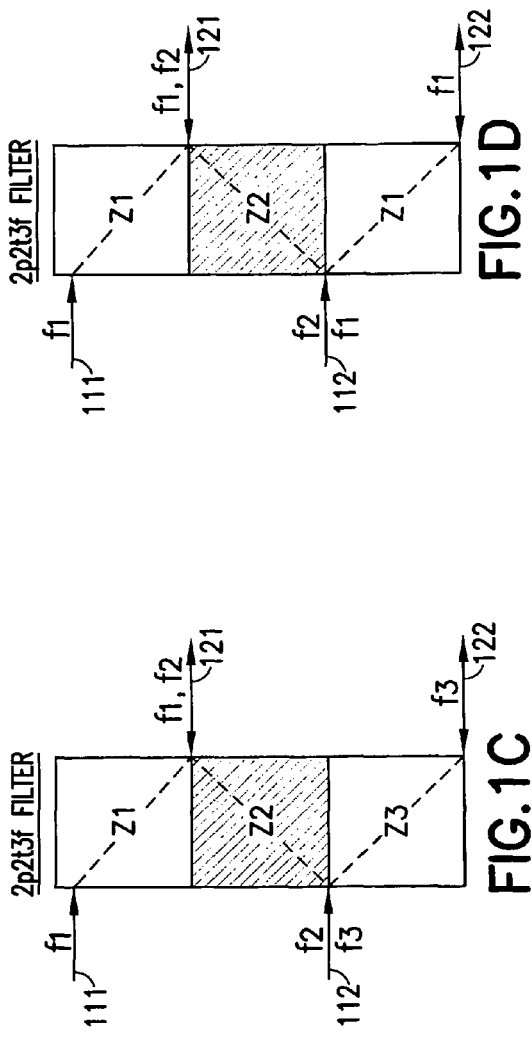

OUTPUT SELECTION OF MULTI-OUTPUT FILTER

TECHNICAL FIELD

The exemplary and non-limiting embodiments of this invention relate generally to wireless communication systems, methods, devices and computer programs and, more specifically, relate to filters for radio signals.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Currently, radiofrequency (RF) switches are used to combine multiple RF filters so that a single input or output can be used. One problem with switch based solutions is that one signal at the time can be connected to the output signal path. To address this problem, diplexers and duplexers have been developed which combine two input signals to generate one output signal. Diplexers can be extended to triplexers, which combine three input signals into a one output signal.

A diplexer is a passive device that implements frequency domain multiplexing. Diplexers are generally considered to be dual port, single throw devices. Two ports L and H (e.g., at which low frequency and high frequency signals are applied) are multiplexed onto a third port S. The signal to the common third port is thrown from the first port and from the second port. The signals on ports L and H occupy disjoint frequency bands. Consequently, the signals on L and H can coexist on port S without interfering with each other.

The diplexer, being a passive device, is reciprocal. The device itself doesn't have a notion of input or output. In the example above, the low frequency portion of a signal input to the third port S is thrown to the first port L and the high frequency portion of that same input signal is thrown to the second port H for output from the diplexer. Regardless of direction of signal propagation through the diplexer, the single common port S denotes it as a single throw device since the signal portions that are 'thrown' to ports L and H are from that common 'throw' terminal S. Diplexers differ from passive combiners or splitters. The combiner is not frequency selective. There also a power "loss" issue—a combiner takes all the power delivered to the S port and equally divides to the remaining two ports. A diplexer does not split power. A diplexer multiplexes two ports onto one port or vice versa, and is commonly used in frequency domain duplex (FDD) systems.

It is known to extend the diplexer concept to larger numbers of ports to multiplex. A three-port to one-port multiplexer is also known as a triplexer. The triplexer structure combines three inputs into one common output and so is a triple pole, single throw device. Triplexers are used in wideband code division multiple access (WCDMA) band I and VI. A further extension is the quadplexer, which combines four inputs into one common output as a quad pole, single throw device These filters may be seen to have the form (n)pst in which (n) indicates the number of poles and 'st' indicates a single throw filter, or in alternative terminology they are single output n-input filters. In order to design such filters, they all need to be designed at the same time with a joint optimization. This is due to fact that all filters are interconnected to each other since those are sharing a common output port. This is a difficulty in implementing such filters in practice.

SUMMARY

The foregoing and other problems are overcome, and other advantages are realized, by the use of the exemplary embodiments of this invention.

In a first aspect thereof the exemplary embodiments of this invention provide an apparatus that comprises a first filter, a second filter, a third filter, a first common node and a second common node. The first filter is configured to exhibit a first frequency response and comprises a first node and a second node. The second filter is configured to exhibit a second frequency response and comprises a first node and a second node. The third filter is configured to exhibit a third frequency response and comprises a first node and a second node. The first common node is adapted to interface the second node of the first filter with the second node of the second filter. And the second common node is adapted to interface the first node of the second filter with the first node of the third filter. The second frequency response exhibited by the second filter isolates a first signal passing along a first signal path that goes between the first node of the first filter and the first common node from a second signal passing along a second signal path that goes between the second common node and the second node of the third filter.

In a second aspect of an exemplary embodiment of the invention there is an apparatus that comprises a first filter arranged to interface a first pole terminal to a first throw terminal; a second filter arranged to interface a second pole terminal to the first throw terminal; and a third filter arranged to interface the second pole terminal to a second throw terminal.

In a third aspect of an exemplary embodiment of the invention there is a memory storing a program of machine readable instructions executable by a controller to perform actions. In this exemplary embodiment the actions comprises determining an operational condition for radios interfaced to one or more antennas via a filtering arrangement; determining filtering characteristics for at least one tunable filter of the filtering arrangement that are associated with the determined operational condition; and applying control signals which set the determined filtering characteristics to the at least one filter of the filtering arrangement at a time the operational condition is active. In this exemplary embodiment the filtering arrangement comprises at least a first filter arranged to interface a first pole terminal to a first throw terminal; a second filter arranged to interface a second pole terminal to the first throw; and a third filter arranged to interface the second pole terminal to a second throw terminal.

In a fourth aspect of an exemplary embodiment of the invention there is a method that comprises determining an operational condition for radios interfaced to at least one antenna via a filtering arrangement, determining filtering characteristics for at least one tunable filter of the filtering arrangement that are associated with the determined operational condition, and applying control signals which set the determined filtering characteristics to the at least one tunable filter of the filtering arrangement at a time the operational condition is active. In this method the filtering arrangement comprises a first filter arranged to interface a first pole terminal to a first throw terminal, a second filter arranged to interface a second pole terminal to the first throw terminal, and a third filter arranged to interface the second pole terminal to a second throw terminal.

BRIEF DESCRIPTION OF THE DRAWINGS

FIG. 1A shows a schematic diagram of a filter arrangement according to an exemplary embodiment of the invention having two poles, two throws and three filters of which one is coupled across a pole terminal that is common to one pair of filters (impedances z1 and z2) and a throw terminal that is common to a different pair of filters (impedances z2 and z3).

FIG. 1B is an equivalent circuit diagram of FIG. 1A.

FIGS. 1C and 1D show the filter arrangement of FIG. 1A with different use cases, using 3 and 2 frequency inputs, respectively.

DETAILED DESCRIPTION

Figure 2B:
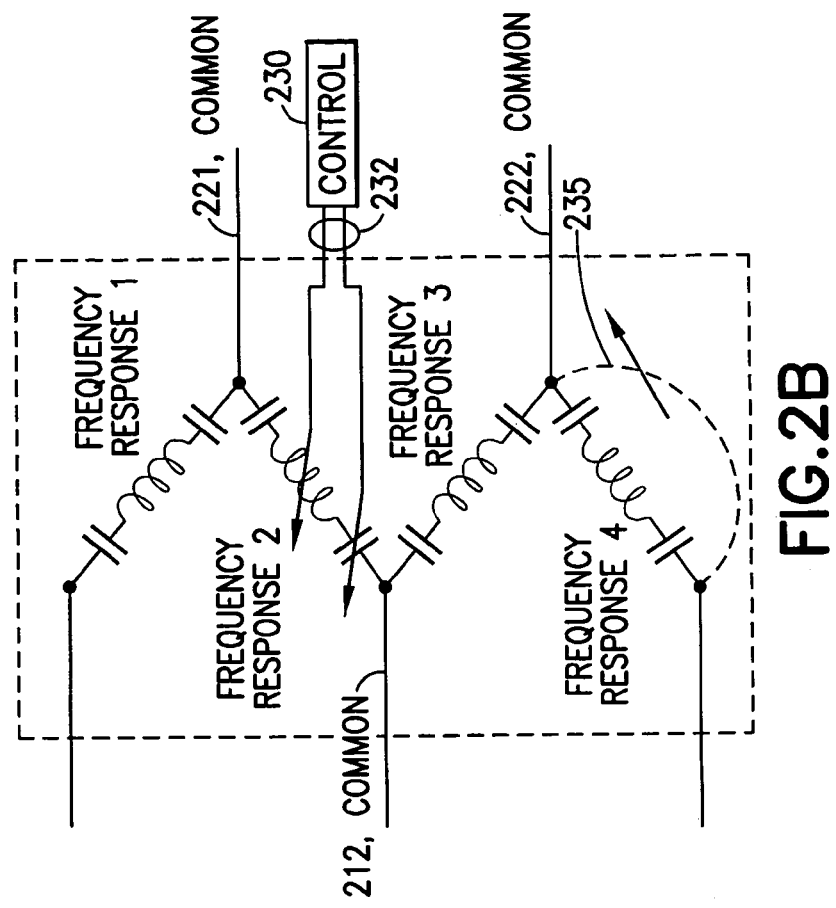
FIG. 2B illustrates and equivalent circuit diagram of FIG. 2A.

In order to better detail the exemplary embodiments of the invention presented herein and its distinctions over the prior art, we introduce a terminology to characterize the filters presented by example herein as (m) poles or pole terminals, (k) connected filters, and (n) throws or throw terminals. In shortened terms any such filter may be referred to as (m)p(n)t(k)f, where (m) is the number of pole terminals 'p' in the filter arrangement, (n) is the number of throw terminals 't' in the arrangement, and (k) is the number of interconnected filters 'f' in the arrangement. The term 'number of filters' reflects the number of distinct physical filtering operations that may be performed on different signal paths through the arrangement, each signal path interfacing one pole terminal to one throw terminal. Such signal paths through the filtering apparatus are shown in the appended figures as dashed lines.

Because any pole terminal or throw terminal may be an input or output depending on the configuration of the filtering apparatus and the filtering response of the filters given signals applied to the poles/throws, the pole terminals and the throw terminals may be referred to as simply nodes. Each filter of the arrangement may be considered as having a first node (e.g., that node depicted on the pole side of the illustrations) and a second node (e.g., that node depicted on the throw side of the illustrations). When the individual filters are considered in this manner, the illustrated and described common nodes (whether poles or throws) may be considered as interfacing the first nodes of adjacently depicted filters or interfacing second nodes of adjacently depicted filters within an arrangement.

Using this terminology, a conventional diplexer would then be depicted as 2p1t2f; and a conventional triplexer would be depicted as 3p1t3f. A simple example embodiment of the invention is shown in schematic diagram at FIG. 1A as a 2p2t3f filter arrangement. At the filter arrangement of FIG. 1A, a first filter 101 interfaces a first pole terminal 111 to a first throw terminal 121; and a second filter 102 interfaces a second pole terminal 112 to the first throw terminal 121 and a third filter 103 interfaces the second pole terminal 112 to a second throw terminal 122. When signals are simultaneously on the signal paths through filters 101 and 103, the second filter 102 operates to isolate them from one another. A distinction over conventional duplexers and triplexers lies in that all pole terminals of the FIG. 1A filter arrangement interconnect through the arrangement to any of the throw terminals. Prior art arrangements in which a diplexer or triplexer is coupled to a separate but distinct filter couple output-to-input of the distinct devices, wherein for the arrangement of FIG. 1A all pole terminals interface to all throw terminals.

But the distinction of the exemplary filter arrangements presented herein goes beyond whether the arrangement is manufactured as a single component or separately. Substantively and for the exemplary embodiment of FIG. 1A, a distinction lies in the fact that the frequency response of the second filter 102 (with impedance z2) isolates the first filter 101 (with impedance z1) and the third filter (with impedance z3), and so they may be considered as independent filters from one another. No inter-coupling of separate and distinct prior art filters is seen capable of this filter isolation function.

One technical aspect of this is that it gives the circuit designer flexibility to design those two filtering functions for filters 101 and 103 separately. This yields a lower insertion loss compared to the triplexer approach, and introduces the possibility to use the same frequency filters in a single filtering structure.

This technical aspect is illustrated at FIG. 1B which shows an equivalent circuit to the 2p2t3f filter structure of FIG. 1A. Each filter provides its own frequency response. Since frequency response 2 of the second filter 102 spans the shared input pole terminal 112 and the shared output throw terminal 121, then the frequency response of the first filter 101 is independent of the frequency response of the third filter 103.

In general terms, filter arrangements according to some example embodiments may be expressed with the formula:

$$[(k/2)+1]p(k/2)t(k)f;$$

where k is the integer number of filters k>2;

(k/2)+1 is the number of pole terminals and the value [(k/2)+1] is rounded down to the nearest integer (for the case [(k/2)+1] is not an integer directly), and t is the number of throw terminals and the value (k/2) is rounded up to the nearest integer (for the case (k/2) is not an integer directly).

Referring again to FIG. 1A, the 2p2t3f filtering structure combines three filters 101, 102 and 103 which have two inputs 111, 112 total, one of which 112 is shared among adjacent filters 102, 103. It also has two outputs 121, 122, one of which 121 is also shared among two adjacent filters 101, 102 (though shared among different filters than the shared input in this instance).

Consider FIGS. 1C and 1D, which repeat the 2p2t3f configuration of FIG. 1A which is the smallest and the most simple filter arrangement illustrated. Two use-cases are shown for the same filter, FIG. 1C with three frequencies and FIG. 1D with two frequencies. At FIG. 1C, a first input signal at frequency f1 is input to the first pole terminal 111 and a second input signal spanning frequencies f2 to f3 is input to the second pole terminal 112. Signal paths through all three filters are active, and so output at the first throw terminal 121 of FIG. 1C is a first output signal which is the multiplexed f1 and f2 frequencies and output simultaneously from the second throw terminal 122 is a second output signal at frequency f3 alone.

That same filter is shown at FIG. 1D with the same first input signal at frequency f1 being input to the first pole terminal 111 and a second input signal spanning frequencies f1 to f2 being input to the second pole terminal 112. Signal paths through all three filters are again active. The first output signal at the first throw terminal 121 of FIG. 1D is the same multiplexed f1 and f2 frequencies as in FIG. 1C, but for this use case, simultaneously output from the second throw terminal 122 of FIG. 1D is the second output signal at frequency f1 alone. FIG. 1C has three different frequency ranges in the input signals and FIG. 2 has only two. The above description for FIGS. 1C and 1D assumes that all of the involved filters are optimized for the individual frequencies. This may be implemented as lumped components with fixed filtering characteristics (e.g., fixed frequency selectivity) or by control inputs (see FIG. 2A) which selectively set the frequency response of the various filters according to the specific signals that are input to the filtering arrangement.

Figure 2A:
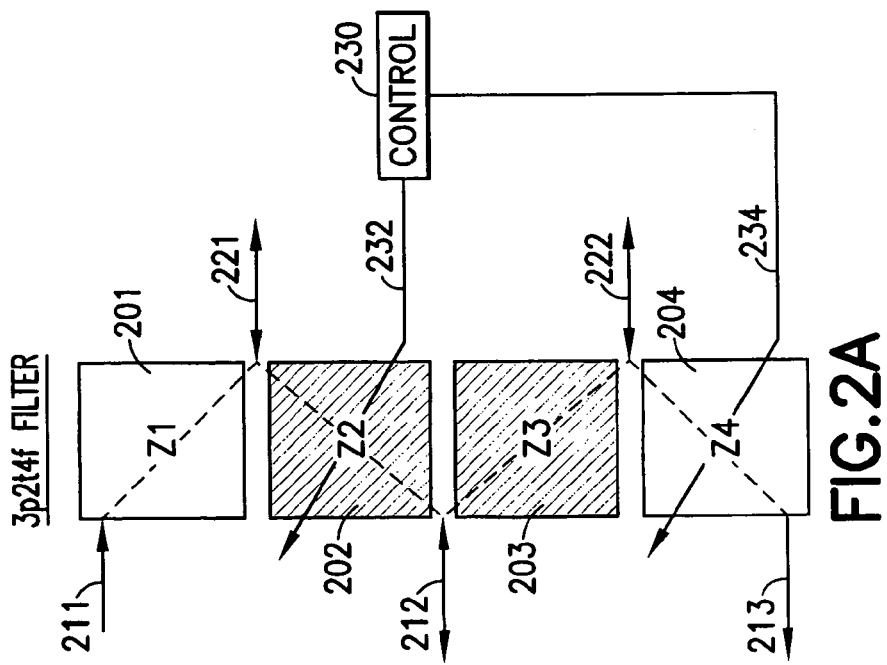
FIG. 2A shows an exemplary 3-pole, two-throw, four filter arrangement according to an exemplary embodiment of the invention.

Using the general formula above, FIG. 1A is extended to a 3p2t4f filter structure shown schematically at FIG. 2A. This filtering structure combines four filters 201, 202, 203 and 204 which have three inputs 211, 212 and 213 in total. One of those inputs 212 is shared with a first adjacent pair of filters 202 and 203, and each of the two outputs 221 and 222 are shared among pairs of filters 201 with 202 and 203 with 204, each of which are different than the shared input pair of filters 202 and 203. The throw terminals 221, 222 of the 3p2t4f filter arrangement at FIG. 2A (and/or the similarly extended 4p3t6f filter arrangement at FIG. 3) may be connected directly to antennas or to other components e.g. switches, amplifiers, phase shifters, coupling elements, isolator elements or further filters which may be distinct from the filter arrangements detailed thus far.

As noted above with FIGS. 1A and 2A, one distinction over conventional diplexer and triplexer and quadplexer structures is that for each pole terminal shared among a first pair of filters and each throw terminal shared among a different second pair of filters, there is one filter that interfaces that shared pole terminal and throw terminal, and that interfacing filter is a member of both the first pair and the second pair. A conventional triplexer would have all inputs/poles connected into a single common node/throw. In practice, this disables the same frequency usage in a single structure. The one common node of such a conventional arrangement results in the requirement that all filters need to be commonly optimized, which is not the case for the filter arrangements according to exemplary embodiments of the invention.

Consider again the 3p2t4f filter arrangement of FIG. 2A. This is shown as a set of equivalent lumped circuit elements at FIG. 2B, using conventional representations for capacitors, resistors and inductors. With reference to this equivalent circuit diagram showing the essential signal paths as well as that shown at FIG. 1B, then it is difficult to identify exactly which component is used to combine different frequency responses to each other, or which components are used to generate a frequency response of the signal path. By eliminating redundancy circuit elements, the need for optimization across the multiple filters has been removed. The end result is that certain remaining elements, such as the inductor 150 which offset at FIG. 1B by the circle, then carries on multiple functions.

For example, the circled inductor 150 or capacitors may be implemented in practice with, for example, a lumped component, a distributed element, a cavity resonator or a surface acoustic or a bulk acoustic resonator or any combination of these or multiple ones of them.

In alternative example embodiments, filtering structures/ resonators within the equivalent circuit shown at FIG. 2B (within the dotted line box) may be implemented at least partly or completely by, for example, surface acoustic wave SAW filters, bulk acoustic wave BAW filters, or combinations of them.

As shown conventionally at FIGS. 2A-2B by the controller 230, these elements may be also tunable, for example, micro electro-mechanical machine MEMS) based elements. A processor 230 or other control logic inputs a control signal(s) to the tunable control input 232 of the second filter 202 to set the filtering response of that second filter. By example FIG. 2A also shows a tunable control input 234 to the fourth filter 204, though it is understood that any one or multiple ones of the filters 201-204 of the exemplary filtering arrangement may be dynamically tunable via a control signal 232 from a controller 230. A tunable element(s) may be implemented to all filters and controls of the tunable filtering may be applied for all filters and those may be shared in order to reduce the actual amount of control signals. The control signals may be activated and/or altered during the operation of the device/component and those may be activated and/or altered according the operational condition of the device and/or the filter. Alternatively the control signals may be activated or altered based on the activity of the radio or the expected or the present radio interference condition of the radio. The radio interference may be generated by other radio integrated into the same device or it may be an external radio device.

Also shown at FIG. 2B as an alternative example embodiment is an additional alternative signal path 235 through the fourth filter 204 shown as a dotted line path. In an example embodiment, this additional and alternative signal path 235 imposes substantially a 180 degree phase shift between connection points in order to improve transmission signal isolation to the reception band. This alternate signal path 235 may be considered as a feed forward style signal cancellation, and in an example embodiment it is switchable (note the control arrow) according to a control input 234 so that it may be activated if needed or the frequency characteristics/filter response along that alternate path 235 may be modified by input from the controller 230.

As can be appreciated, one distinction of some example embodiments of these filter arrangements over the prior art diplexers/triplexers/quadplexers is the number of signal terminals and the number of signal paths through the arrangement. Such a filter arrangement may be considered as a frequency selective conveyor. By such a frequency selective conveyor of RF signals, the number of operational RF bands that can be handled may be extended, using a fixed, limited number of inputs of the RF integrated circuit RFIC (e.g., the RF transceiver front end) in which such a filtering arrangement may be embodied.

Figure 2C:
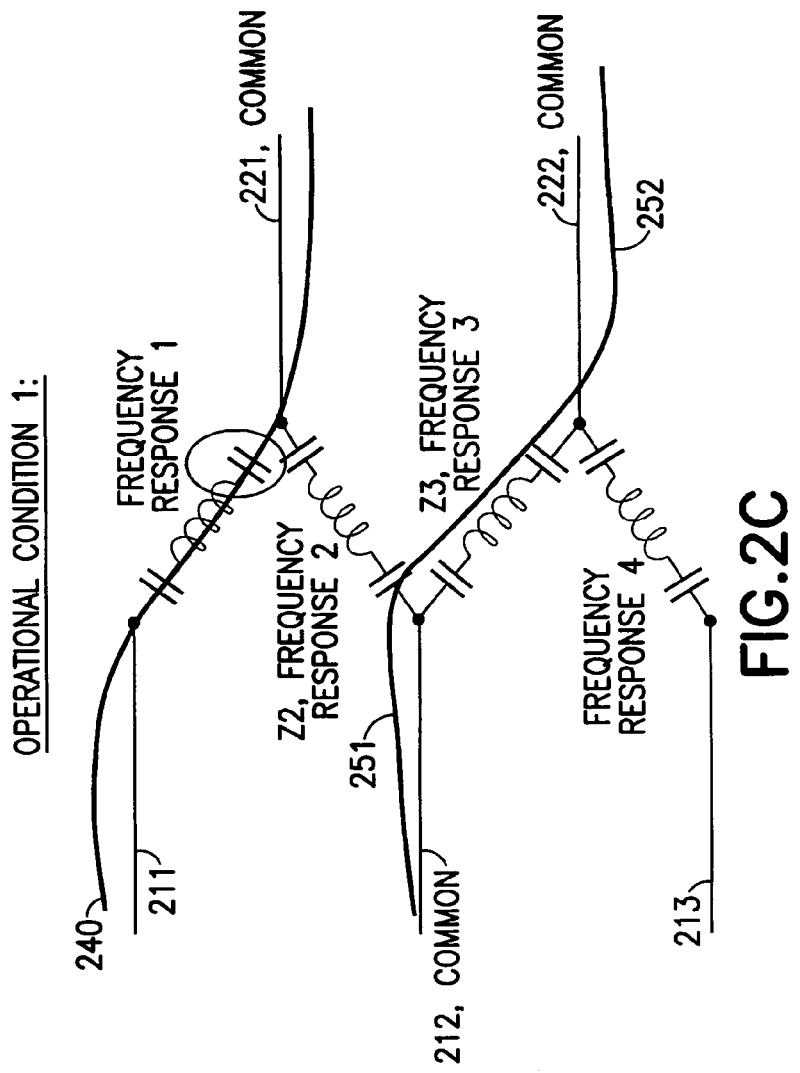
FIGS. 2C and 2D illustrate different operational conditions for the filter arrangement of FIG. 2A showing differing functions for filters depending on use of the filtering arrangement.
Figure 2D:
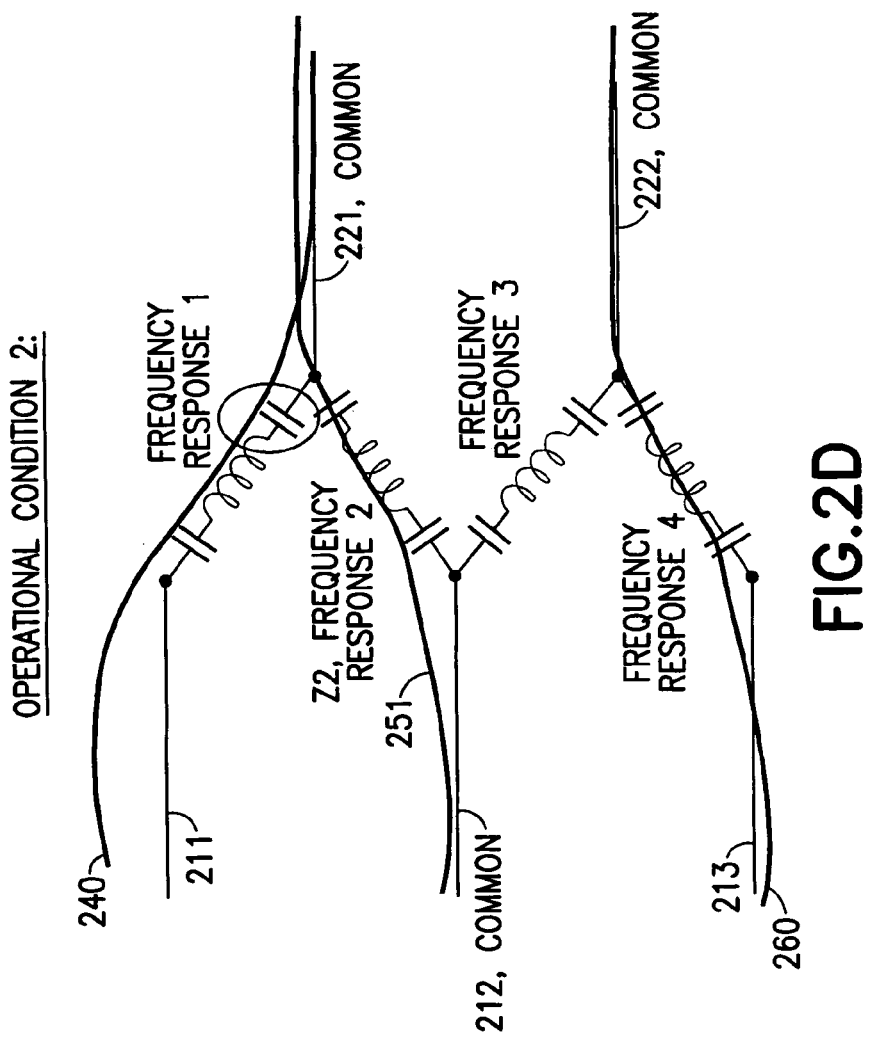

Consider FIGS. 2C and 2D, which are exemplary use cases for the 3p2t4f filter arrangement of FIG. 2A. In a first operational condition shown at FIG. 2C, the two illustrated signal paths 240, 252 are isolated from each other by the frequency response of the second filter 202. This means that the second filter 202 is used as an isolation element for signals on lines 240 and 252, and this removes need of a switch. In a second operational condition shown at FIG. 2D, the signal 251 from the common input/pole terminal 212 is passed through the second filter 202, and therefore the second filter 202 is a part of a signal path 251. Still at FIG. 2D, the third filter 203 operates similarly to the second filter 202 in operation condition 1 at FIG. 2C; in this case as an isolation element between signals 251 and 260. In alternative example embodiment the signal paths 240 and 252 may be selected together after terminal 221 and 222 in the first operational condition. The selection may be done with a switch. In the second operational condition the signal paths 240 and 251 may be combined together in terminal 221. In an alternative example embodiment the signal paths 240 and 252 may be combined together after terminal 221 and 222 in the first operational condition. In the second operational condition the signal paths 240 and 251 may be combined together in terminal 221.

Like FIGS. 1C and 1D, FIGS. 2E and 2F illustrate different use cases for different input signal frequencies, but this time for the 3p2t4f filter arrangement of FIG. 2A. At FIG. 2E a first input signal at the first pole terminal 211 has frequency range f1, a second input signal at the second (common) pole terminal 212 has frequency range f2 to f3, and a third input signal at the third pole terminal 213 has frequency range f4. The first filter 201 interfaces the first signal from the first pole terminal 211 to the first (common) throw terminal 221; and the second filter 202 interfaces the f2 frequency portion of the second input signal at the second (common) pole terminal 212 to that same first throw terminal 221 to output a first output signal that is f1 multiplexed with f2. Note that the third pole terminal 213 is now used as an output terminal. The third filter 203 interfaces the f3 frequency portion of the second signal from the (common) second pole terminal 212 to the second (common) throw terminal 222 where the f3 signal is output. The fourth filter 204 interfaces a third input signal at frequency f4 from the second (common) throw terminal 222 where it is input to the third pole terminal 213 where that f4 signal is output. Signals f3 and f4 move in opposite directions at that throw terminal 222; f3 being output there and f4 being input there. In an alternative example embodiment at least one of the signals 211, 212, 213, 221 and 222 is bi-directional. In an alternative example embodiment at least one of the signals 211, 212, 213, 221 and 222 is not present all the time, for example a time division multiplexed signal where transmission and reception signals are active sequentially.

Figure 2F:
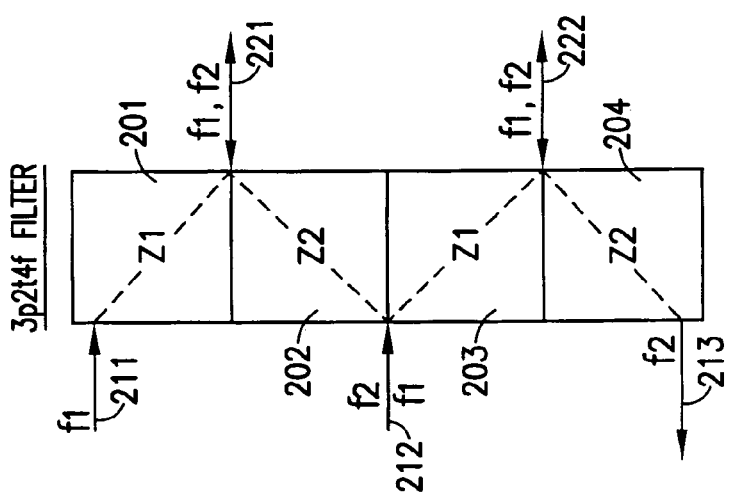
FIGS. 2E and 2F show the filter arrangement of FIG. 2A with different use cases, using 4 and 2 frequency inputs, respectively.

FIG. 2F uses the same 3p2t4f filter structure for input signals spanning two frequency ranges f1 and f2. A first input signal at the first pole terminal 211 has frequency range f1, a second input signal at the second (common) pole terminal 212 has frequency range f1 to f2, and a third input signal at the third pole terminal 213 has frequency range f2. The first filter 201 interfaces the first signal from the first pole terminal 211 to the first (common) throw terminal 221; and the second filter 202 interfaces the f2 frequency portion of the second input signal at the second (common) pole terminal 212 to that same first throw terminal 221 to output a first output signal that is f1 multiplexed with f2. This output is identical to that on the companion throw terminal 221 at FIG. 2E. Like FIG. 2E, at FIG. 2F the third pole terminal 213 is also used as an output terminal. The third filter 203 of FIG. 2F interfaces the f1 frequency portion of the second signal from the (common) second pole terminal 212 to the second (common) throw terminal 222 where the f1 signal is output. The fourth filter 204 interfaces a third input signal at frequency f2 from the second (common) throw terminal 222 where it is input to the third pole terminal 213 where that f2 signal is output. Signals f1 and f2 move in opposite directions at that throw terminal 222; f1 being output there and f2 being input there.

Figure 2E:
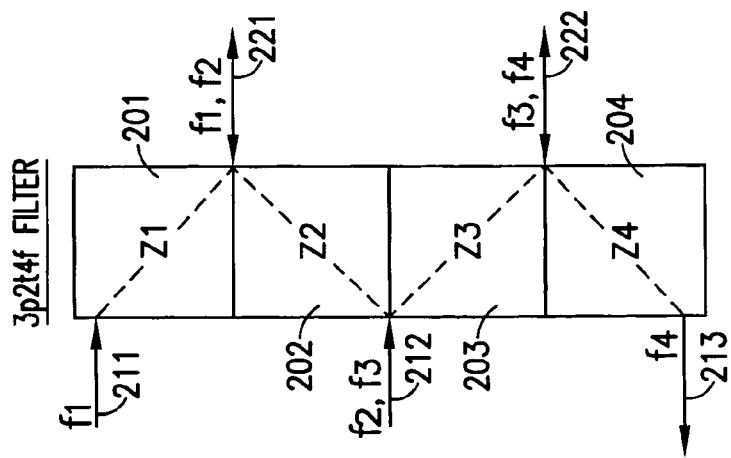

The 3p2t4f filter design as in FIG. 2E may be done as separate filters, when isolation between operational frequencies f2 and f3 is high enough or pass bands of the second 202 and third 203 filters are separated enough from each other's pass bands. Since the second 202 and third 203 filters are isolation elements for the first 201 and second 204 filters, then the first filter impedance z1 and the fourth filter impedance z4 are almost invisible to each other since impedances of those are seen throughout a combined impedance z3 and z2 of the two intervening filters 202, 203.

Thus the design of a 3p2t4f filter is seen to be simpler than design of a quadplexer, since only two adjacent filters are inter-connected and only two filters are needed to be optimized at the same time (e.g. for FIG. 2A, first filters 201 and 202, then filters 202 and 203 and then filters 203 and 204). Typically according to some example embodiments of this invention, as detailed above, there would be no need for joint optimization of all four filters at the same time. The joint optimization is easier, when the selection of the combined filters and operational frequencies is done so that operational pass band frequencies of adjacent filters are as separate in the frequency domain as possible.

Figure 3:
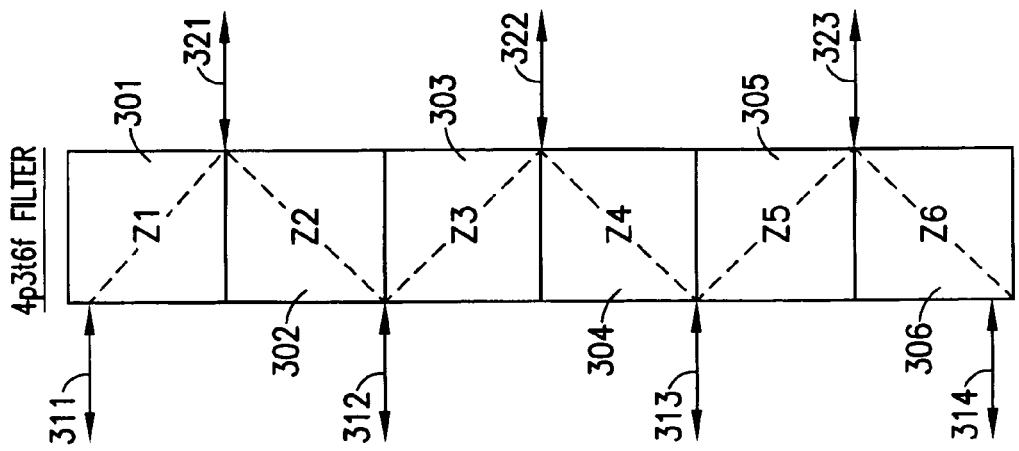
FIG. 3 shows an exemplary four-pole, three-throw, six-filter arrangement according to an exemplary embodiment of the invention.

The above filter arrangements may be combined to achieve even more extended filter arrangements. For example, FIG. 3 shows a 4p3t6f filter arrangement, which may be considered as an extension of the 3p2t4f structure. Similar to the arrangements above, FIG. 3 has a first filter 301 that interfaces a first pole terminal 311 to a first (common) throw terminal 321; a second filter that interfaces a second (common) pole terminal 312 to the first throw terminal 321; and a third filter 303 that interfaces the second pole terminal 312 to a second throw terminal 322. This by itself is similar in structure to FIG. 1A. Extending it by the fourth filter, which interfaces a third pole terminal 313 to the second throw terminal 322, makes the second throw terminal 322 also a common terminal (common to the third and fourth filters 303, 304) and is similar to the structure of FIG. 2A. Extending this further by a fifth filter 305 that interfaces the third pole terminal 313 to a third throw terminal 323 makes the third pole terminal 313 a common one (common to the fourth and fifth filters 304, 305). FIG. 3 further comprises a sixth filter 306 that interfaces a fourth pole terminal 314 to the third throw terminal 323, thereby making the third throw terminal a common one between the fifth and sixth filters 305, 306.

Similarly, a 3p3t5f structure may be considered an extended configuration for 2p2t3f filter structure. Various combinations of these may be structured to yield more extensions. A 2p4t6f filter arrangement may be considered as a combination of the 3p2t4f filter and the 2p1t2f filter; a 2p5t6f filter arrangement may be considered as a combination of the 3p2t4f filter and the 2p1t2f filter; and a 2p5t8f filter arrangement may be considered as a combination of the 3p2t4f filter and two 2p1t2f filters. These are non-limiting examples and the permutations may be continued further.

Figure 5:
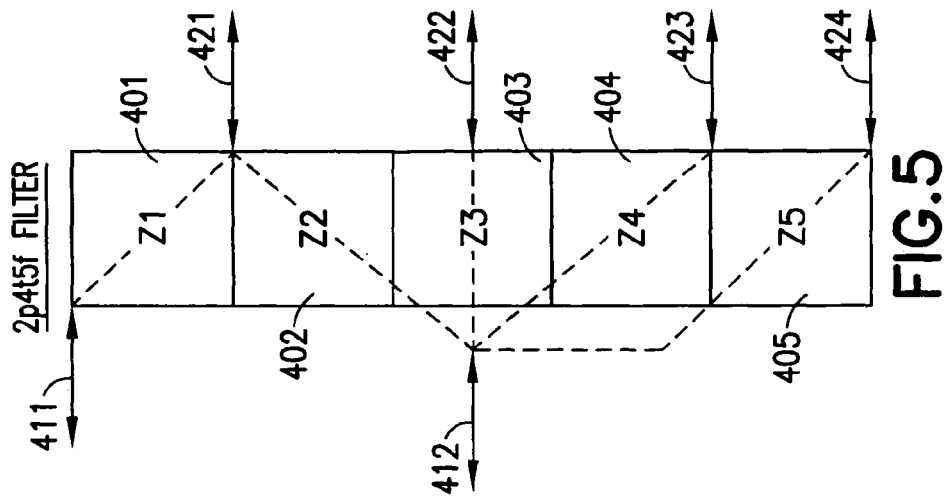
FIG. 5 shows a variation similar in principle to that of FIG. 4 but a filter arrangement in which five filters interface two poles to four throws.
Figure 4:
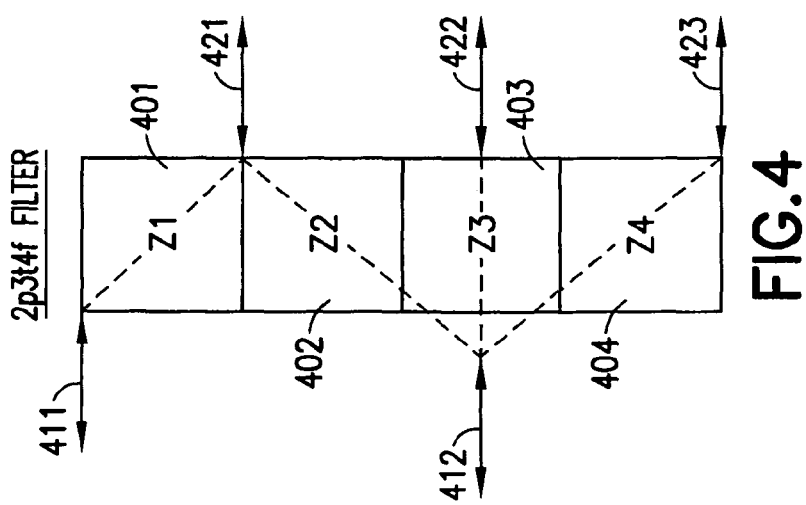
FIG. 4 shows a variation to the filter arrangement of FIG. 2A in which there are two poles and three throws interfaced by four filters.

FIGS. 4 and 5 are different in kind from mere extensions of FIG. 2A with additional filters and poles/throws. The filter arrangement of FIG. 4 may be considered a 2p3t4f filter arrangement. Similar to FIG. 1A, a first filter 401 interfaces a first pole terminal 411 to a first throw terminal 421; a second filter 402 interfaces a second pole terminal 412 to the first throw terminal 421, and a third filter interfaces the second pole terminal 412 to a second throw terminal 422. But unlike the arrangements of FIG. 2A in which a fourth filter interfaces a third pole terminal to the second throw terminal, at FIG. 4 there is a fourth filter 404 that interfaces the second pole terminal 412 to a third throw terminal 423. The second pole terminal 412 is common to three filters 402, 403 and 404, and there is a third throw terminal that is not common but only interfaces by the fourth filter 404.

FIG. 5 takes the form of a 2p4t5f filter arrangement, which is similar to FIG. 4 but extends it by a fifth filter 405 which interfaces the second pole terminal 412 to a fourth throw terminal 424. The second pole terminal 412 in FIG. 5 is common to all four throw terminals, and throw terminals 423 and 424 are not common as only one filter (404 and 405, respectively) interfaces them to a pole terminal (412).

FIGS. 4 and 5 are exemplary only; various other arrangements may be made in which a single pole terminal is common to more than two filters, and further variations may be had in which different pole terminals interfacing through different filter pairs to the same throw terminal. For example, extend FIG. 5 by a sixth filter which interfaces the first pole terminal 411 to the fourth throw terminal 424. The filtering function of the first filter 411 may differ from the filtering function of the sixth filter and so the output on the first throw terminal 421 would differ from the output on the fourth throw terminal 424 in such an arrangement, regardless of the signal input to the second pole terminal 412.

Now consider some exemplary dispositions of filter arrangements according to these teachings in radio equipment. While certain radio technologies are shown in these examples, the radio technology is not limiting to the use of filtering arrangements according to these teachings, which may be advantageously employed in radio equipment compliant with GSM, WCDMA, LTE, CDMA, FDD, TDD, Bluetooth, WLAN, WiMax, GPS, DVB-T/H/S, and MediaFlo, to name a few. Control inputs for tunable filtering characteristics may be implemented with serial or parallel bus architectures/connections, or with static radio-frequency control lines with voltage control. The exemplary filtering structures may be implemented as an integrated circuit, such as for example a low-temperature co-fired ceramic chip LTCC. A module embodying a tunable filtering structure according to these teachings may comprises filters, one or more switches, one or more controllers, one or more voltage drivers, one or more capacitor value controllers, one or more controllable components, forward and/or reverse power detectors, and one or more phase shifters. The filters may be used for transmit only, for receive only, for transmit and receive, and any of these may be implemented with a main receiver and/or with a diversity receiver. A few of these implementations are shown by example at FIGS. 6-11.

Figure 6:
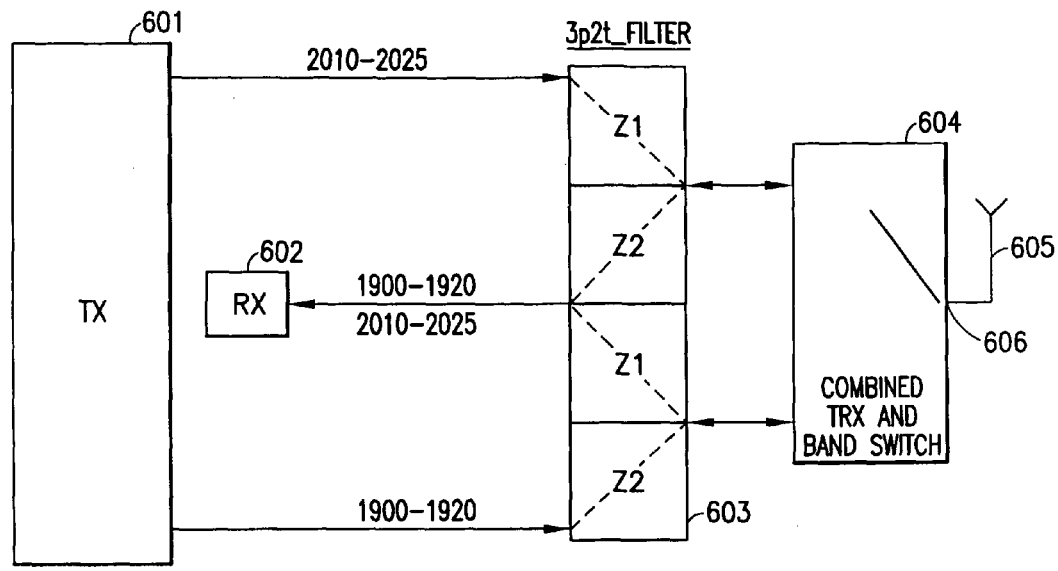
FIGS. 6-12C illustrate different embodiments of radio circuitry into which exemplary embodiments of the filter arrangement according to the invention is disposed.

FIG. 6 illustrates an example embodiment particularly adapted for long term evolution of EUTRAN (universal mobile telecommunications system terrestrial radio access network, or 3.9 G also known as LTE) time division duplex TDD bands 33 and 34. FIG. 6 uses a 3p2t4f filter 603 to interface the receiver 602 on the common pole terminal via both of the common throw terminals of that filter 603 to two poles of a single pole two throw antenna switch 604 (used as a transmit receive/band switch) and the antenna 605. At the same time the antenna 605 is interfaced through both parallel poles of the three pole T/R and band switch 604 to the transmitter via the common throw terminals of the filter 603 via the non-common pole terminals. By such an architecture additional switches may be avoided. Those switches would be needed to take advantage of the shared RX/TX filter topology in a conventional solution. The frequency bands shown in FIG. 6 are analogous to f1 and f2 shown at FIG. 2F, though the directions of signal propagation are not identical.

Note that a combined transmit/receive and band switch 604 at the antenna 605 is employed at FIG. 6. For the 3p2t4f filter case shown specifically at FIG. 6, this differs from a conventional embodiment in that functionality of that switch 604 is increased; conventional architecture is seen to use only a band switch in that position.

A quadplexer structure is not applicable for a conventional architecture here since there are two filters operating at the same frequency and therefore, at the same time, TX and RX paths are connected to the antenna port since all filters are sharing a common antenna port in this architecture, that nearest the antenna 605 itself.

Figure 7:
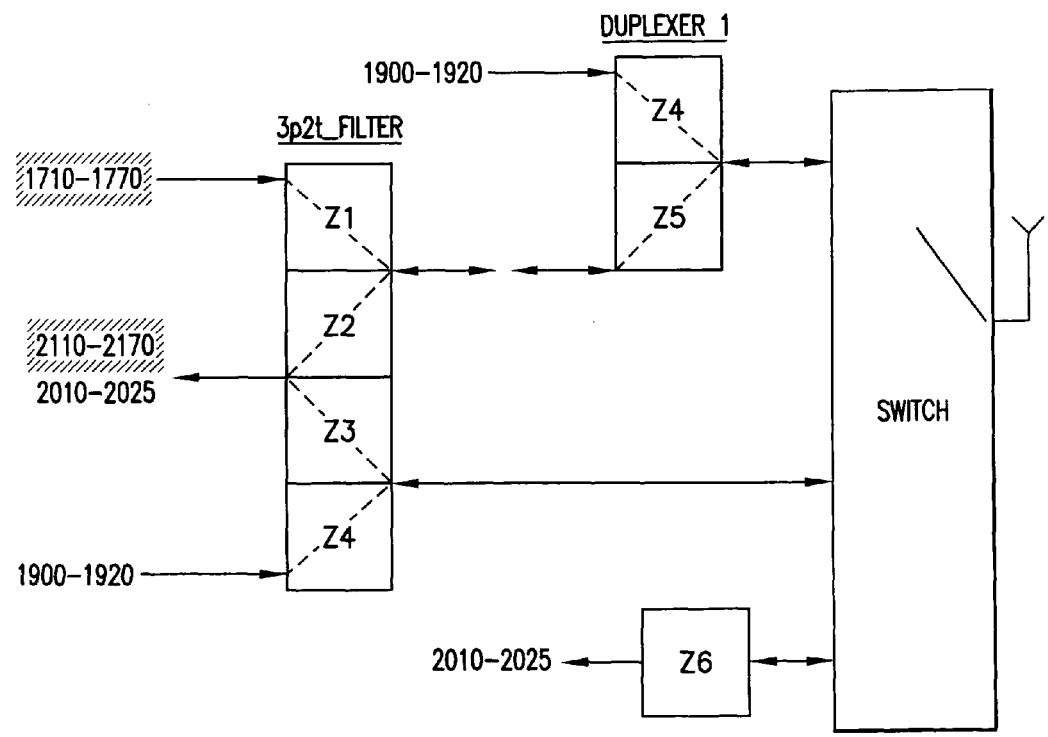

Consider another example shown at FIG. 7. A 3p2t4f filter is used for combining two TDD and one frequency division duplex FDD system, for example LTE TDD bands 33 and 34 with LTE FDD band 10. As shown there, the 3p2t4f filter outputs may be connected further to other components such as the duplex filter shown. In this case the first switch nearest the antenna may be used as combined TDD RX or TDD TX selector and TDD/FDD band selector. A filter, or additional duplex filters which are connected to the illustrated 3p2t4f filter, may be simply low pass or high pass filters. Selection of the filter arrangement of duplexers and the 3p2t4f filters may be optimized so that adjacent filters are distant from each other's operational frequencies, in order to make filter design easier and in order to have the maximum attenuations between filters. The 3p2t4f filter arrangement and the 2p1t2f duplexer as arranged in FIG. 7 are used to make a 4p2t6f filtering structure. The three-state antenna switch may port to/from the 3p2t4f filter (either directly or through further components such as the illustrated duplexer), with one or more ports bypassing that 3p2t4f filter arrangement as seen at the bottom of FIG. 7.

Figure 8:
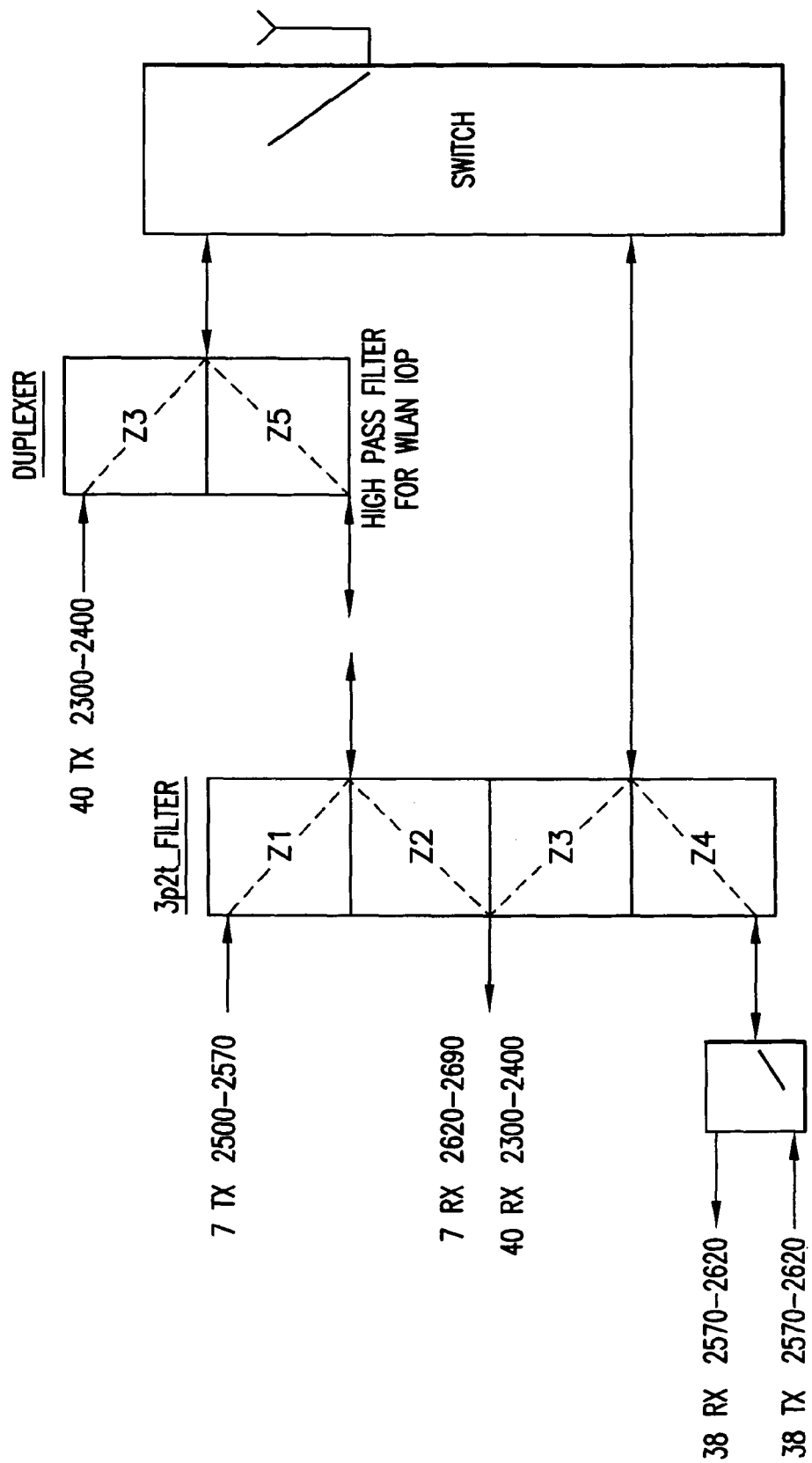
Figure 9:
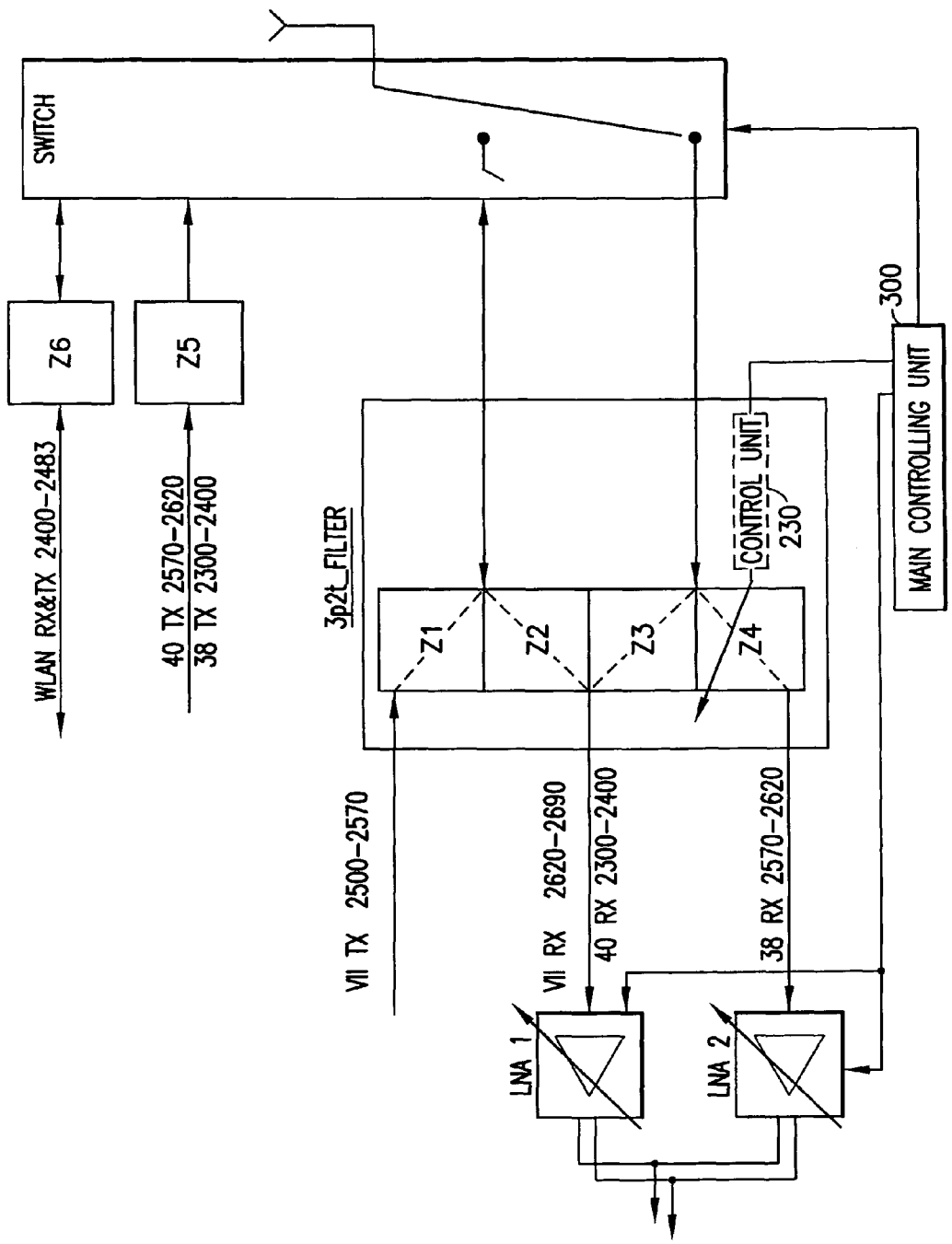

FIG. 8 illustrates an example embodiment that enables operation in LTE FDD Band 7 and TDD bands 38 and 40. The 3p2t4f filter and the 2p1t2f duplexer are used to make a 4p2t6f filtering structure. FIG. 9 illustrates an example embodiment that enables operation in LTE FDD Band 7 and TDD bands 38 and 40 and also WLAN operation. The fourth filter of the illustrated 3p2t4f filter arrangement has a control input with filter parameters (e.g., impedance, pass band, high frequency cutoff, low frequency cutoff, etc.) selectable by the controller 230 such as that described with respect to FIG. 2A. Such a controller 230 may be slaved to a main controller 10A/42 (see FIG. 15) which ultimately controls the filtering parameters based on the radio use case present on the poles/throws of the filter arrangement at any given moment. Alternatively, if there are sufficient control terminals available at the main controller, the main controller 10A/42 may selectively set the filter parameters directly; the slaved filter controller 230 is useful if there are not enough spare terminals on the main processor chip and the slaved filter controller 230 may be embodied on a separate CMOS chip. Such a main control unit 10A/42 may also correspondingly control other components along the signal lines such as switching component operation(s) or low noise amplifiers for the various bands as shown.

Figure 10:
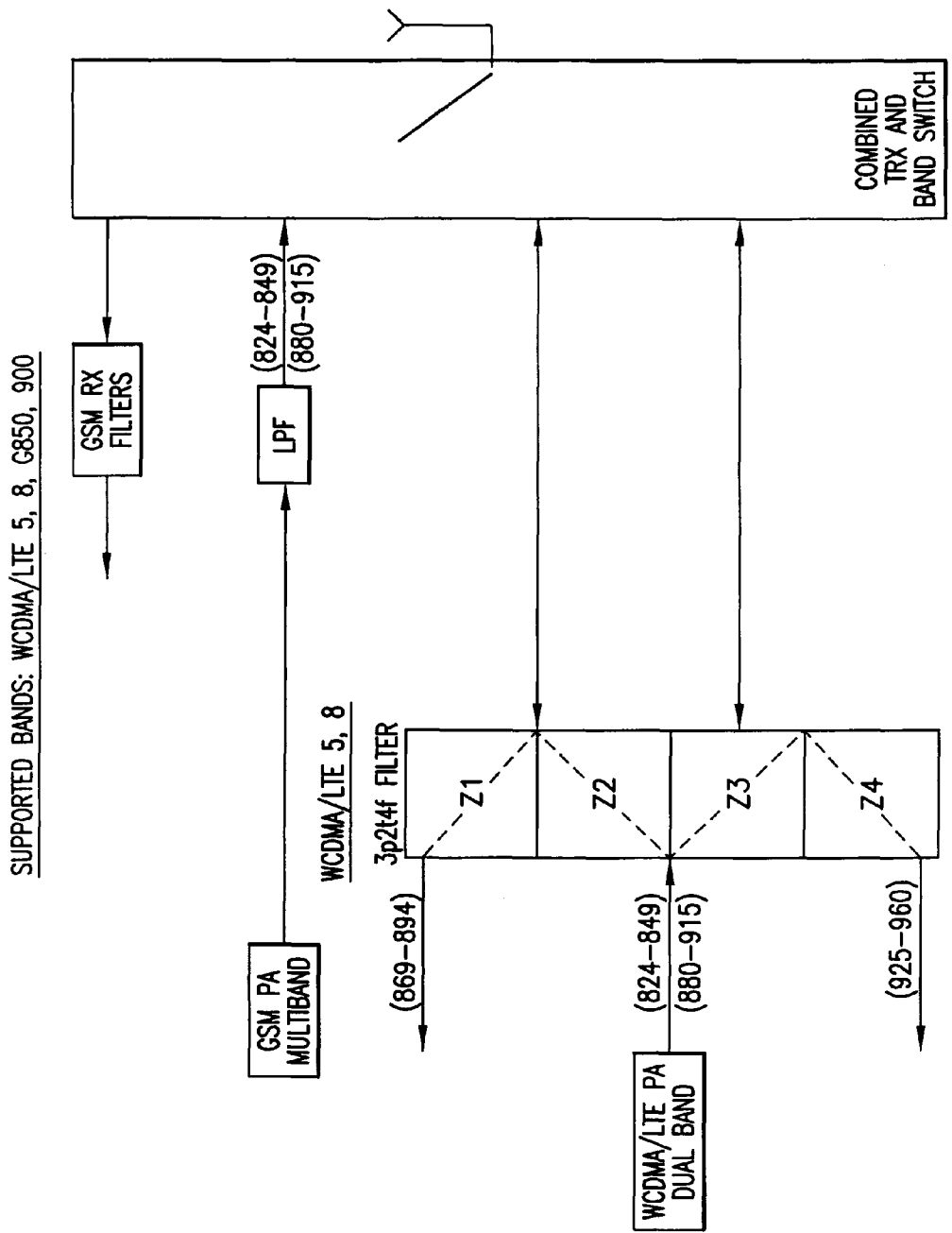
Figure 11:
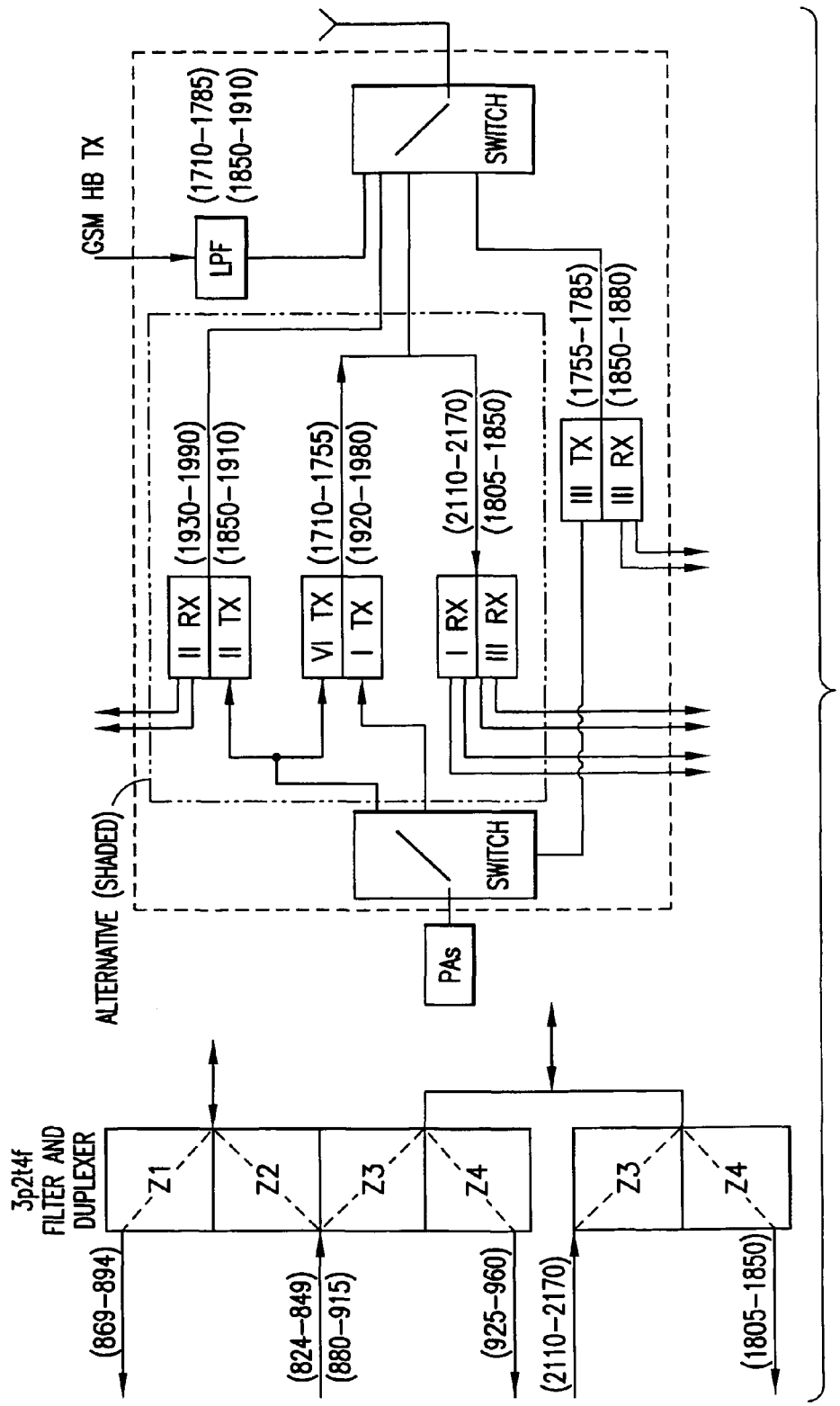

It is noted that each of the switches at FIGS. 6-10 and 12C as well as the rightmost switch in FIG. 11 which are disposed between the described filter and the antenna may be considered to have an antenna node (shown in FIG. 6 as reference number 606) that interfaces that switch to the antenna. The common nodes/throw terminals at FIGS. 12A and 12B may be considered also antenna nodes.

For each of FIGS. 1-13, all of the filters shown may be single-ended or balanced filters; they may comprises tunable elements which may modify frequency characteristics of the filter, such characteristics being, for example, attenuation of the pass band, attenuation of the stop band, and/or steepness of the transition band. In FIGS. 6-10, the switch operates as a combined band selection and TRX (transmission/reception) switch.

In the exemplary embodiments of FIGS. 7 and 8, which show a 3p2t4f filter connected with a duplexer, such an arrangement may be used to combine at least two LTE TDD bands and one LTE FDD band into one antenna.

In FIG. 8 for example, the second duplex filter (which is connected to the 3p2t4f filter) may be a high band filter as shown there, providing extra attenuation for WLAN frequencies. All of those systems are operating substantially at the same frequency band.

As shown particularly at FIG. 9 but understood for any of FIGS. 6-13, reception signals from the filtering structures may be connected to directly to low noise amplifiers (LNAs), which may be integrated to the RFIC or may be external to the RFIC. For example, external LNA outputs may be combined together prior to signal input to the RFIC in order to reduce the number of inputs to the RFIC, as shown at FIG. 9 at LNA1 and LNA2 with their signal outputs combined. As illustrated there, these LNAs are controllable so that at least one frequency characteristic of either LNA may be modified. Such a modification may be done when the LNA is in the ON state, or it may be switched off which turns the LNA into a high impedance mode. The control input to these LNAs or control of a tunable filtering component may be done at least according to the used frequencies for TX/RX, the used modulation of the TX/RX signals, according to TX and/or RX activity of radio itself or other radio coupled the same device, according to the used frequencies of other radios in the same terminal device, and/or according to current and/or expected external and/or internal radio interference condition. As an example the modification of the frequency characteristics of the LNA2 improves the attenuation between signals passing through the third filter and the fourth filter seen from the output of the LNAs. This improved attenuation may be needed in specific interference signal conditions, when the wanted signal is passing through the third filter and the interference signal may be leakage through the signal passing through the fourth filter. An alternative method to increase the attenuation to the signal through the fourth filter is to control at least one tunable element of the fourth filter. The actual tuning may be done with a control circuit 230 which may be integrated to the same package (integrated circuit chip) with the filter. The control circuit 230 may operate individually or it may be controlled by a main controlling unit 10A/42.

Another interference signal leakage may occur from signal through the second filter to the wanted signal path 3 through the third filter. An alternative method to improve the attenuation is to add an additional switch to the switching unit which disconnects the signal passing through the second filter more effectively.

The exemplary embodiment of FIG. 10 shows a transceiver front end architecture supporting 850 MHz and 900 MHz bands. The exemplary embodiment of FIG. 11 shows a RF front end architecture supporting simultaneous high bands, 5 WCDMA/LTE bands and two GSM/EDGE bands. Each of FIGS. 10 and 11 show examples by which a 3p2t4f filter is used to reduce the amount of needed switches in order to support multiple FDD systems.

The 3p2t4f filter separates a common transmission line into bands V and VIII in the exemplary embodiment of FIG. 10. The 3p2t4f filter arrangement of FIG. 10 interfaces a (power amplifier PA of) a dual band WCDMA/LTE radio with the T/R and band switch to the antenna. The switch also interfaces a power amplifier of the transmit side of a GSM radio via a low pass filter and further the conventional receive filters of the GSM radio. The same filter operates as a receiver duplex filter for both exemplary embodiments of FIG. 10 and FIG. 11, and the switch illustrated there acts as a transmit/receive switch and as a band selector.

The 3p2t4f filter and a duplex filter are combined in the exemplary embodiment of FIG. 11. In this exemplary embodiment the duplex filter and the 3p2t4f filter outputs are connected together, somewhat similar to a quadplexer structure. A delay line(s) may be imposed in order to make separation between the physical filters, as is known in the art to improve filter isolation.

Figure 12A:
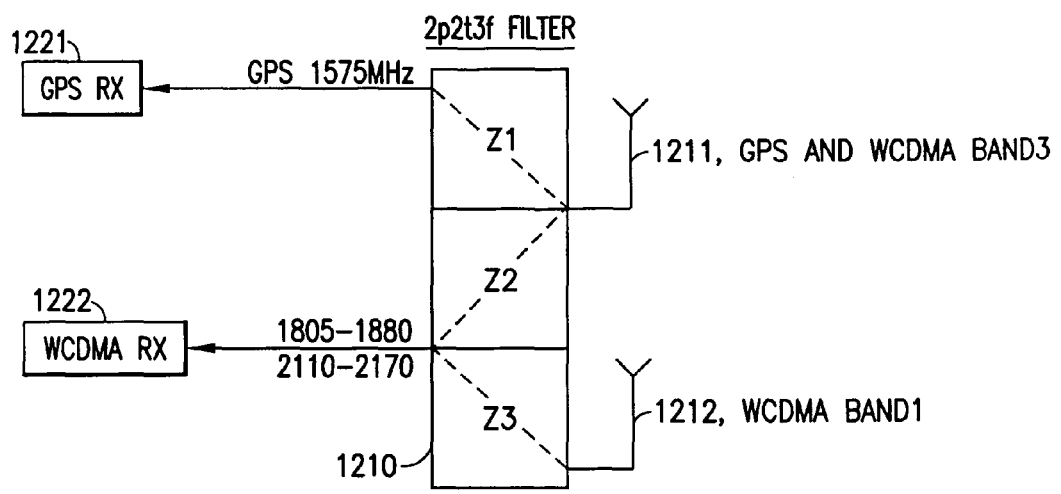

FIG. 12A illustrates another disposition of the exemplary filter arrangement 1210 with radio equipment, in which the illustrated 2p2t3f filter arrangement 1310 is connected directly to antennas 1211 and 1212 at the throw terminals. As shown, only the receivers 1221 (GSP) and 1222 (WCDMA) are interfaced to the antennas by such a direct connection.

Figure 12B:
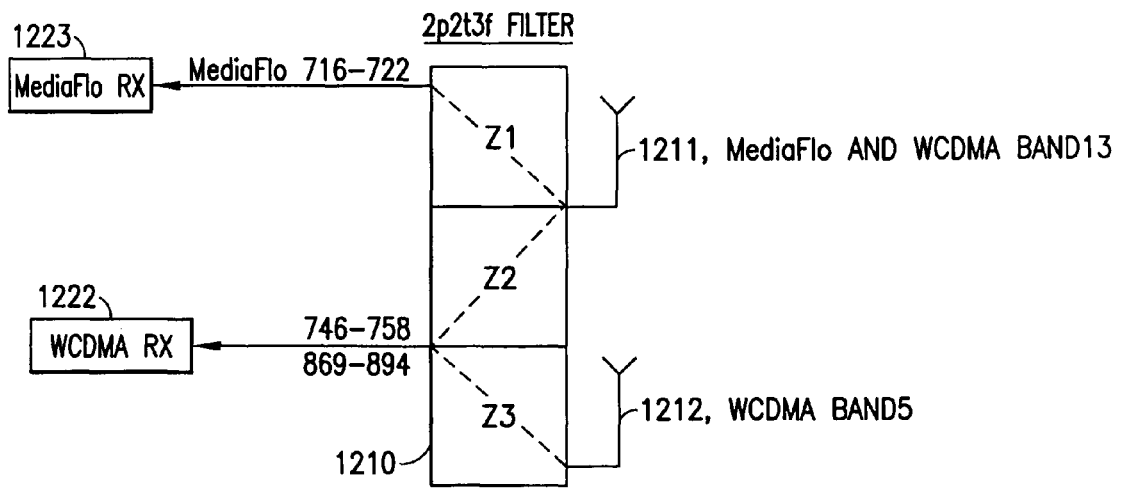
Figure 12C:
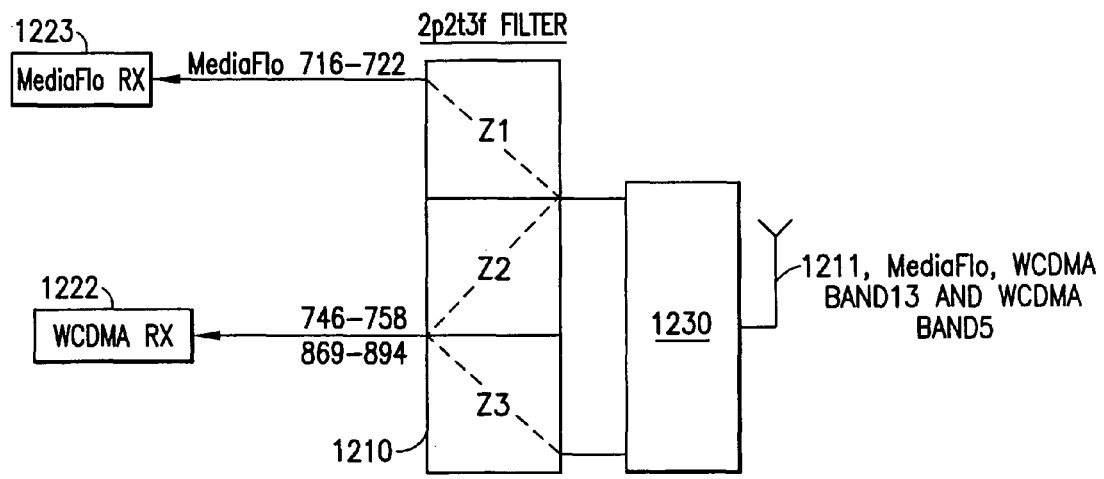

FIG. 12B illustrates a similar arrangement as FIG. 12B but for MediaFlo and WCDMA receivers. Unlike FIG. 12A, these are frequency adjacent systems allocated to the two antennas 1211, 1212 via the directly connected filter arrangement 1210. The frequency bands of FIG. 12A are not adjacent but spaced from one another. The filtering characteristics of the various filters within the arrangement 1210, which may be static or dynamically set, may separate the relevant frequencies in either spaced or adjacent frequency band scenarios. FIG. 12C illustrates a similar arrangement as FIG. 12B, but two antenna outputs are combined with a diplexer 1230. Additional antenna tuning may be used to tune the antenna resonance to the operational frequency, shown in FIG. 12C with an arrow over the antenna to indicate that it is tunable. The actual antenna tuning may be done with an external antenna tuning element which may be connected to any antenna galvanic connection point. An alternative approach to tune the antenna is to use capacitive loading of the antenna resonator.

Figure 13:
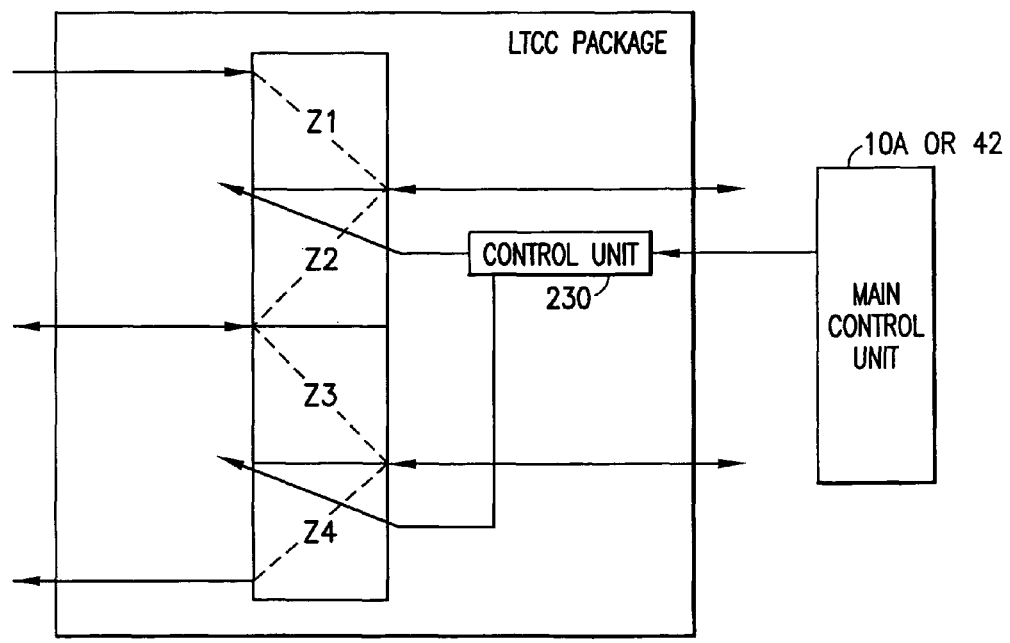
FIG. 13 illustrates an exemplary embodiment of the filter arrangement of FIG. 2A made in an integrated circuit and incorporated with other radio circuitry according to another exemplary embodiment of the invention.

FIG. 13 shows a particular embodiment of the filter arrangement embodied in a low-temperature co-fired ceramic LTCC chip on which is also disposed the control circuitry 230 for controlling the filter parameters of the variable filters as noted above. Such control circuitry 230 may be under direction of a main control unit which may be a master controller 10A of an overall device (e.g., mobile terminal, base station, relay station, etc.) to which all other controllers are slaved, or a baseband controller 42 that controls baseband signal processing as will be detailed below. The two illustrated throw terminals may be coupled to antennas either directly or through further components such as the combined transmit/receive and band switch detailed above; and the three pole terminals may be coupled to transmitters and/or receivers of various disparate radios within the overall radio device (e.g., mobile terminal, base station, relay station, etc.) also as detailed above. Software running the control circuit 230 and/or the master/baseband controller 10A/42 may be disposed on-chip or off-chip or partially on and partially off.

Figure 14:
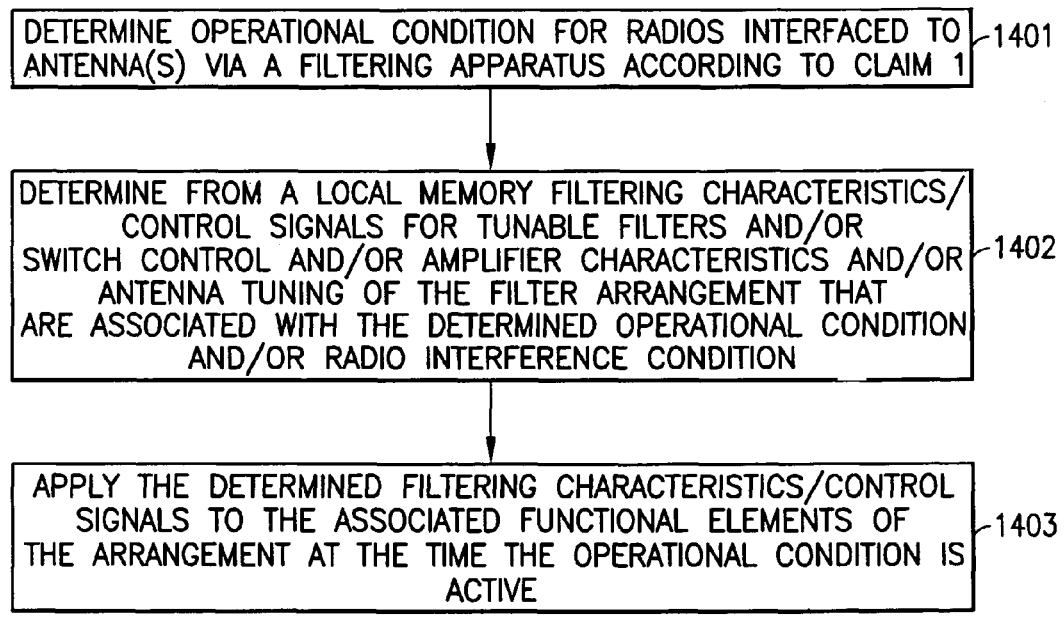
FIG. 14 is a process flow diagram for controlling variable filtering characteristics of filter arrangements according to an exemplary embodiment of the invention such as via locally stored software executed by filter control circuitry and/or a main control unit.

Operation of such exemplary software is shown at FIG. 14. At block 1401 the operational condition is determined for radios that are interfaced to antenna(s) via a filtering apparatus according to the exemplary embodiments detailed herein. The operational condition is what frequencies are being transmitted and received at what times and for what radios along what propagation paths through the circuitry. This is a known prior art technique to set the signal pathways properly given scheduled transmissions and receptions at the radio apparatus, whether mobile station, base station or relay station. Additionally, the operational condition which is used as a basis for the control may be adjusted by a radio interference condition. A radio interference condition may be a present interference condition or expected interference condition when two bands (either to/from different radios or transmit/receive bands for the same radio) interfere with one another or where one radio band is interfered with noise. The interference may be, for example, at least one of a wideband noise interference, an intermediation interference, a cross modulation interference, a harmonic interference and a blocking interference. The interference condition may be introduced by a signal that is operational in the at least one of the signals pathways through the circuitry. The interference condition may be dynamic since the radio signal which generates interference may be time domain discontinuous. The present and/or expected interference condition may be defined by a processor block which may receive activity information and information of the operational conditions of the radios such as from transmit and receive scheduling, which is used to determine the operational condition. A control signal may be dynamically altered based on the radio interference condition and the current operational condition of the filter. At block 1402 then the filtering characteristics/control signals for tunable filters of the filter arrangement and/or switch control and/or amplifier characteristics and/or antenna tuning that are associated with the determined operational condition are determined from the software stored in the local memory of the device. The controlling of the switch may select at least one of the operational conditions of the filter for the signal routing. The selection of the signal routing may be done according to the frequency characteristics of the signal paths. The selection of the signal routing may be done so that the radio interference condition is optimum for the signal being passed through the filter. The controlling of the switch may be used if the desired signal is combined with other alternative signal paths of the filter. At block 1403 those control signals which set the filtering characteristics are applied to the associated filters of the arrangement and/or switch control and/or amplifier characteristics and/or antenna tuning at the time the operational condition is active.

Certain exemplary embodiments of this filtering arrangement offer the following technical aspects:

fewer switches are needed when multiple systems are integrated to operate with shared antennas. E.g. two TDD systems may be combined with one switch which operates as a combined TRX and band switch.

A 3p2t filter allows co-operation of different systems since switches are selecting one signal path at the time to be connected to antenna but the 3p2t filter enable at least two signals to be connected to a same antenna at the same time.

Fewer component pins are needed as compared to a switch-based solution. For example, in the two TDD case one switch has dual operation TX and RX switch and band switch operations at the same time.

It is simpler to design filters according to these teachings than triplexers or quadplexers, since with a 3p2t filter only adjacent filters are needed to be joint optimized as compared to a triplexer or quadplexer in which all filters are needed to be joint optimized.

Better performance is expected from a 3p2t filter arrangement than a triplexer or a quadplexer So according to exemplary embodiments of these teachings there is an apparatus/circuit/filtering arrangement that comprises: a first filter having a first node and a second node with a first frequency response, a second filter having a first node and a second node with a second frequency response, a third filter having a first node and a second node with a third frequency response, a first common node interfacing the second node of the first filter with the second node of the second filter, and a second common node interfacing the first node of the second filter with the first node of the third filter. In such an exemplary filter, a first signal path between the first node of the first filter and the first common node and a second signal path between the second common node and the second node of the third filter are isolated from each other by the frequency response of the second filter.

Figure 15:
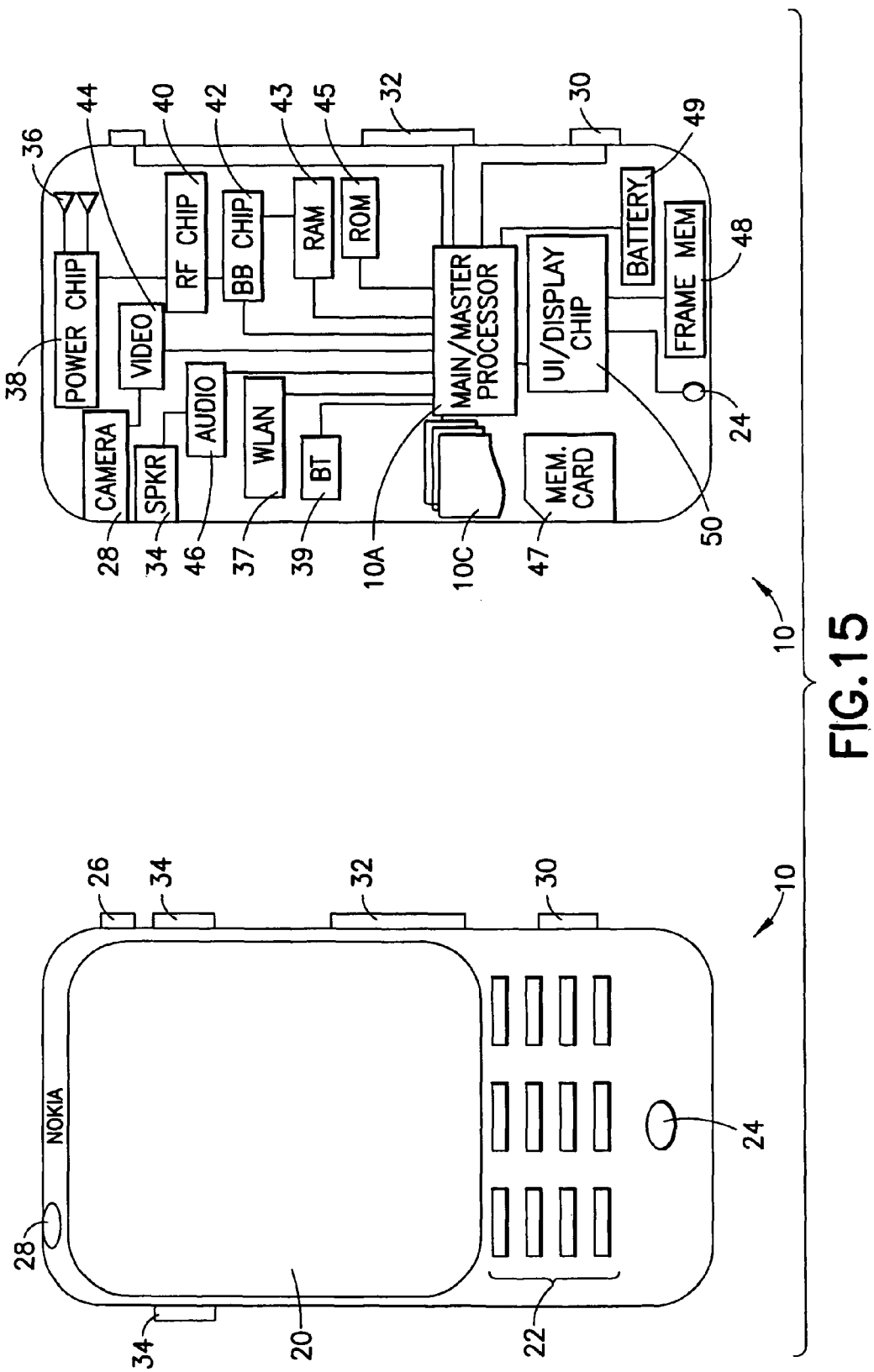
FIG. 15 shows in plan and sectional views a particularized block diagram of a user equipment in which exemplary embodiments of this invention might be advantageously disposed.

The filters according to these teachings are advantageously disposed as part of a chipset or as a module or in a wireless communication equipment 10 such as that shown at FIG. 15, such as a base station or mobile terminal/user equipment (UE). Such an apparatus or device comprises a digital processor DP 10A, a computer readable memory 10B that stores an executable program 10C such as one to control the frequency selective characteristics of the filter, and further has a transceiver 10D. At least one of the programs 10C is assumed to comprises program instructions that, when executed by the associated DP 10A, enable the device to operate in accordance with the exemplary embodiments of this invention, as will be discussed below in greater detail.

That is, the exemplary embodiments of this invention may be implemented at least in part by computer software executable by the DP 10A of the device 10, or by hardware, or by a combination of software and hardware (and firmware).

In general, the various embodiments of the UE 10 may comprise, but are not limited to, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions, wireless signal routers, wireless signal relays, base stations.

The computer readable memory may be of any type suitable to the local technical environment and may be implemented using any suitable data storage technology, such as semiconductor based memory devices, flash memory, magnetic memory devices and systems, optical memory devices and systems, fixed memory and removable memory. The DP 10A may be of any type suitable to the local technical environment, and may comprise one or more of general purpose computers, special purpose computers, microprocessors, digital signal processors (DSPs) and processors based on a multicore processor architecture, as non-limiting examples.

FIG. 15 illustrates detail of an exemplary UE in both plan view (left) and sectional view (right), and the invention may be embodied in one or some combination of those more function-specific components. Similar functionality and hardware may be disposed in a base transceiver station, with the illustrated antennas being embodied in the base station as an antenna array. In light of the relevant similarities, the UE 10 will be assumed to show exemplary embodiments also in the base station. At FIG. 15 the UE 10 has a graphical display interface 20 and a user interface 22 illustrated as a keypad but understood as also encompassing touch-screen technology at the graphical display interface 20 and voice-recognition technology received at the microphone 24. A power actuator 26 controls the device being turned on and off by the user. The exemplary UE 10 may have a camera 28 which is shown as being forward facing (e.g., for video calls) but may alternatively or additionally be rearward facing (e.g., for capturing images and video for local storage). The camera 28 is controlled by a shutter actuator 30 and optionally by a zoom actuator 32 which may alternatively function as a volume adjustment for the speaker(s) 34 when the camera 28 is not in an active mode.

Within the sectional view of FIG. 15 are seen multiple transmit/receive antennas 36 that are typically used for cellular communication. The antennas 36 may be multi-band for use with other radios in the UE. The operable ground plane for the antennas 36 is shown by shading as spanning the entire space enclosed by the UE housing though in some embodiments the ground plane may be limited to a smaller area, such as disposed on a printed wiring board on which the power chip 38 is formed. The power chip 38 controls power amplification on the channels being transmitted and/or across the antennas that transmit simultaneously where spatial diversity is used, and amplifies the received signals. The power chip 38 outputs the amplified received signal to the radio-frequency (RF) chip 40 which demodulates and downconverts the signal for baseband processing. The baseband (BB) chip 42 detects the signal which is then converted to a bit-stream and finally decoded. Similar processing occurs in reverse for signals generated in the apparatus 10 and transmitted from it.

Signals to and from the camera 28 pass through an image/video processor 44 which encodes and decodes the various image frames. A separate audio processor 46 may also be present controlling signals to and from the speakers 34 and the microphone 24. The graphical display interface 20 is refreshed from a frame memory 48 as controlled by a user interface chip 50 which may process signals to and from the display interface 20 and/or additionally process user inputs from the keypad 22 and elsewhere.

Certain embodiments of the UE 10 may also comprise one or more secondary radios such as a wireless local area network radio WLAN 37 and a Bluetooth® radio 39, which may incorporate an antenna on-chip or be coupled to an off-chip antenna. Throughout the apparatus are various memories such as random access memory RAM 43, read only memory ROM 45, and in some embodiments removable memory such as the illustrated memory card 47 on which the various programs 10C are stored. All of these components within the UE 10 are normally powered by a portable power supply such as a battery 49.

The aforesaid processors 38, 40, 42, 44, 46, 50, if embodied as separate entities in a UE 10 or base station, may operate in a slave relationship to the main processor 10A which may then be in a master relationship to them. Exemplary embodiments of this invention are most relevant to the RF circuitry, such as for example the RFIC shown as the power chip 38 combined with the RF chip 40, the baseband chip 42, the WLAN chip 37, and possibly also the Bluetooth chip 39. It is noted that other embodiments need not be disposed there but may be disposed across various chips and memories as shown or disposed within another processor that combines some of the functions described above for FIG. 15. Any or all of these various processors of FIG. 15 access one or more of the various memories, which may be on-chip with the processor or separate therefrom. Similar function-specific components that are directed toward wireless communications over a network (e.g., components 36, 38, 39, 40, 42-45 and 47) may also be disposed in exemplary embodiments of the base station/access node, which may have an array of tower-mounted antennas rather than the two shown at FIG. 15.

Note that the various chips (e.g., 38, 40, 42, etc.) that were described above may be combined into a fewer number than described and, in a most compact case, may all be embodied physically within a single chip.

Alternatively, an apparatus according to this invention may be combined with various chips (e.g. 38, 40, 42) to form a chipset. Those various components may be manufactured by multiple parties. Additionally, controlling software may be done by another party and it may be included to the chipset.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors and filters, a digital signal processor or processors, baseband circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. An apparatus comprising:
   a first filter configured to exhibit a first frequency response and comprising a first node and a second node;
   a second filter configured to exhibit a second frequency response and comprising a first node and a second node;
   a third filter configured to exhibit a third frequency response and comprising a first node and a second node;
   a first common node arranged to interface the second node of the first filter with the second node of the second filter; and
   a second common node arranged to interface the first node of the second filter with the first node of the third filter;
   wherein the second frequency response exhibited by the second filter isolates a first signal passing along a first signal path that goes between the first node of the first filter and the first common node from a second signal passing along a second signal path that goes between the second common node and the second node of the third filter.

2. An apparatus according to claim 1, wherein at least one of the first filter, the second filter, and the third filter comprise a control input through which the respective frequency response may be dynamically adjusted.

3. An apparatus according to claim 2, wherein the dynamically adjustable frequency response is adjustable to change at least one of impedance, pass band frequency, stop band attenuation, high frequency cutoff, and low frequency cutoff.

4. An apparatus according to claim 2, further comprising a controller coupled to the control input and configured to dynamically adjust the frequency response of the at least one of the filters according to at least one of an operational condition and an interference condition of radios coupled to any of the first nodes or the first common node of the apparatus.

5. An apparatus according to claim 1, further comprising:
a fourth filter configured to exhibit a fourth frequency response and comprising a first node and a second node; and
a third common node arranged to interface the second node of the third filter with the second node of the fourth filter.

6. An apparatus according to claim 5, further comprising:
a fifth filter configured to exhibit a fifth frequency response and comprising a first node and a second node; and
a fourth common node arranged to interface the first node of the fourth filter with the first node of the fifth filter.

7. An apparatus according to claim 5 wherein:
the first frequency response conveys a signal within a first frequency band between the first node of the first filter and the first common node while the second frequency response conveys a signal within a second frequency band between the second common node of the second filter and the first common node, simultaneous with;
the third frequency response conveys a signal within the first frequency band between the second common node and the third common node while the fourth frequency response conveys a signal within the second frequency band between the first node of the fourth filter and the third common node.

8. An apparatus according to claim 5 wherein:
the first frequency response conveys a signal within a first frequency band between the first node of the first filter and the first common node while the second frequency response conveys a signal within a second frequency band between the second common node of the second filter and the first common node, simultaneous with;
the third frequency response conveys a signal within a third frequency band between the second common node and the third common node while the fourth frequency response conveys a signal within a fourth frequency band between the first node of the fourth filter and the third common node.

9. An apparatus according to claim 5, wherein:
the second common node is coupled to a first receiver;
the first node of the first filter and the first node of the fourth filter are coupled to one of a transmitter and a second receiver;
the second common node is coupled to the other of the transmitter and the second receiver; and
the first common node and the third common node are coupled through a switch to at least one antenna node.

10. An apparatus according to claim 5, wherein:
the first frequency response is adapted to pass a signal within a first frequency band through the first filter to an antenna node;
the second frequency response is adapted to pass a signal within a second frequency band from the antenna node through the second filter;
the third frequency response is adapted to pass a signal within a third frequency band from the antenna node through the third filter; and
the fourth frequency response is adapted to pass a signal within a fourth frequency band from the antenna node through the fourth filter.

11. An apparatus according to claim 1, further comprising:
a fourth filter configured to exhibit a fourth frequency response and comprising a first node and a second node; and
wherein the second common node is arranged to interface the first node of the second filter with the first node of the third filter and with the first node of the fourth filter.

12. An apparatus according to claim 11, further comprising:
a fifth filter configured to exhibit a fifth frequency response and comprising a first node and a second node; and
wherein the second common node is arranged to interface the first node of the second filter with the first node of the third filter and with the first node of the fourth filter and with the first node of the fifth filter.

13. An apparatus according to claim 1, disposed on an integrated circuit.

14. An apparatus according to claim 13, further comprising a switch disposed on the integrated circuit, the switch configured to selectively interface the first common node and the second common node with an antenna node.

15. An apparatus according to claim 14 disposed within a portable user equipment, and configured such that the apparatus lies along two distinct signal paths between two or more radios and one or more antennas of the user equipment; the integrated circuit further comprising an antenna switch configured to selectively couple the one or more antennas to the first common node and to the second node of the third filter.

16. An apparatus according to claim 1, wherein:
the first frequency response is adapted to pass a signal within a first frequency band through the first filter;
the second frequency response is adapted to pass a signal within a second frequency band through the second filter; and
the third frequency response is adapted to pass a signal within a third frequency band through the third filter.

17. An apparatus according to claim 16, further comprising a wideband code division multiple access receiver coupled to the first node of the second filter and to the first node of the third filter;
the apparatus further comprising one of a global positioning satellite receiver and a mediaflo receiver that is coupled to the first node of the first filter.

18. An apparatus according to claim 16, wherein:
the first common node is coupled to a first antenna node and the second common node is coupled to a second antenna node.

19. An apparatus according to claim 16, wherein the first common node and the second common node are selectively coupled to a common antenna node through antenna tuning circuitry.

20. An apparatus according to claim 1, wherein:
the first frequency response conveys a signal within a first frequency band between the first node of the first filter and the first common node while the second frequency response conveys a signal within a second frequency band between the second common node and the first common node, simultaneous with;
the third frequency response conveys a signal within either the first frequency band or within a third frequency band between the second common node and the second node of the third filter.

21. An apparatus according to claim 1, wherein:
at least two of the first node of the first filter, the first common node, the second common node, and the second node of the third filter are bidirectional as both input and output.

22. An apparatus comprising:
   a first filter arranged to interface a first pole terminal with a first throw terminal;
   a second filter arranged to interface a second pole terminal with the first throw terminal; and
   a third filter arranged to interface the second pole terminal with a second throw terminal.

23. An apparatus according to claim 22, wherein at least two of the first throw terminal, the second throw terminal, the first pole terminal and the second pole terminal are bidirectional as both input and output to the respective filter which interfaces them.

24. An apparatus according to claim 23, wherein at least the second filter comprises a control input by which at least one of impedance, pass band frequency, stop band attenuation, high frequency cutoff, and low frequency cutoff of the second filter is adjustable.

25. An apparatus according to claim 22, wherein the apparatus is of the form [(k/2)+1]p(k/2)t(k)f;
   where k is an integer number of filters k>2;
   (k/2)+1 is a number of pole terminals in which a value [(k/2)+1] is rounded down to the nearest integer when [(k/2)+1] is not an integer directly, and
   t is a number of throw terminals and a value (k/2) is rounded up to the nearest integer for the case (k/2) is not an integer directly.

26. An apparatus according to claim 22, disposed within a portable user equipment, and configured such that the apparatus lies along two distinct signal paths between two or more radios and one or more antennas of the user equipment; the integrated circuit board further comprising an antenna switch configured to selectively couple the one or more antennas to the first throw terminal and the second throw terminal.

27. A memory tangibly storing a program of machine readable instructions executable by a controller to perform actions comprising:
   determining an operational condition for radios interfaced to at least one antenna via a filtering arrangement;
   determining filtering characteristics for at least one tunable filter of the filtering arrangement that are associated with the determined operational condition; and
   applying control signals which set the determined filtering characteristics to the at least one tunable filter of the filtering arrangement at a time the operational condition is active;
where the filtering arrangement comprises:
   a first filter arranged to interface a first pole terminal to a first throw terminal;
   a second filter arranged to interface a second pole terminal to the first throw terminal; and
   a third filter arranged to interface the second pole terminal to a second throw terminal.

28. The memory according to claim 27, wherein the filtering apparatus is of the form [(k/2)+1]p(k/2)t(k)f;
   where k is an integer number of filters k>2;
   (k/2)+1 is a number of pole terminals in which a value [(k/2)+1] is rounded down to the nearest integer for the case [(k/2)+1] is not an integer directly, and
   t is a number of throw terminals and a value (k/2) is rounded up to the nearest integer when (k/2) is not an integer directly.

29. The memory according to claim 27, wherein applying the control signals which set the determined filtering characteristics selects signal paths through the filtering arrangement by setting frequency characteristics along at least one of the selected signal paths.

30. The memory according to claim 27, wherein determining the operational condition comprises determining an actual or estimated interference for at least one of the radios.

31. A method comprising:
   determining an operational condition for radios interfaced to at least one antenna via a filtering arrangement;
   determining filtering characteristics for at least one tunable filter of the filtering arrangement that are associated with the determined operational condition; and
   applying control signals which set the determined filtering characteristics to the at least one tunable filter of the filtering arrangement at a time the operational condition is active;
where the filtering arrangement comprises:
   a first filter arranged to interface a first pole terminal to a first throw terminal;
   a second filter arranged to interface a second pole terminal to the first throw terminal; and
   a third filter arranged to interface the second pole terminal to a second throw terminal.

32. The method according to claim 31, wherein the filtering apparatus is of the form [(k/2)+1]p(k/2)t(k)f;
   where k is an integer number of filters k>2;
   (k/2)+1 is a number of pole terminals in which a value [(k/2)+1] is rounded down to the nearest integer for the case [(k/2)+1] is not an integer directly, and
   t is a number of throw terminals and a value (k/2) is rounded up to the nearest integer when (k/2) is not an integer directly.

33. The method according to claim 31, wherein applying the control signals which set the determined filtering characteristics selects signal paths through the filtering arrangement by setting frequency characteristics along at least one of the selected signal paths.

34. The method according to claim 31, wherein determining the operational condition comprises determining an actual or estimated interference for at least one of the radios.

* * * * *